US011356773B2

(12) United States Patent
Brunet et al.

(10) Patent No.: US 11,356,773 B2
(45) Date of Patent: Jun. 7, 2022

(54) NONLINEAR CONTROL OF A LOUDSPEAKER WITH A NEURAL NETWORK

(71) Applicant: Samsung Electronics Co., Ltd., Suwon-si (KR)

(72) Inventors: Pascal M. Brunet, Pasadena, CA (US); Yuan Li, Northridge, CA (US)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 17/085,729

(22) Filed: Oct. 30, 2020

(65) Prior Publication Data

US 2022/0141578 A1    May 5, 2022

(51) Int. Cl.
*H03G 3/00*    (2006.01)
*H04R 3/00*    (2006.01)
*G06N 3/08*    (2006.01)
*G06N 3/04*    (2006.01)
*H03F 3/181*    (2006.01)

(52) U.S. Cl.
CPC ............... *H04R 3/00* (2013.01); *G06N 3/04* (2013.01); *G06N 3/08* (2013.01); *H03F 3/181* (2013.01)

(58) Field of Classification Search
CPC .................................................. H03G 3/00
See application file for complete search history.

(56) References Cited

U.S. PATENT DOCUMENTS

| 4,157,741 A | 6/1979 | Goldwater et al. |
| 4,381,831 A | 5/1983 | Putnam et al. |

(Continued)

FOREIGN PATENT DOCUMENTS

| CN | 107872759 A | 4/2018 |
| EP | 0548836 B1 | 11/1997 |

(Continued)

OTHER PUBLICATIONS

Prosoundweb, "Harman Unveils JBL 3 Series Mk II Powered Studio Monitors," Jan. 2018, pp. 1-4, EH Publishing, United States, downloaded at: https://www.prosoundweb.com/channels/recording/harman-unveils-jbl-3-series-mkii-powered-studio-monitors/.

(Continued)

*Primary Examiner* — Olisa Anwah
(74) *Attorney, Agent, or Firm* — Sherman IP LLP; Kenneth L. Sherman; Hemavathy Perumal

(57) ABSTRACT

One embodiment provides a method comprising inputting into a first layer of a neural network at least one data sample of a current displacement of one or more moving components of a loudspeaker and at least one or more other data samples of one or more prior displacements of the one or more moving components. The method comprises generating in the first layer a data vector by applying a nonlinear activation function based on the at least one data sample of the current displacement and the at least one or more other data samples of the one or more prior displacements. The method comprises inputting into a second layer of the neural network the data vector and applying an affine transformation to the data vector. The method comprises outputting a prediction of a current voltage to apply to the loudspeaker based on the affine transformation applied to the data vector.

20 Claims, 17 Drawing Sheets

(56) References Cited

U.S. PATENT DOCUMENTS

| | | | |
|---|---|---|---|
| 4,580,655 A | 4/1986 | Keele, Jr. et al. | |
| 5,600,718 A | 2/1997 | Dent et al. | |
| 5,870,484 A | 2/1999 | Greenberger et al. | |
| 6,005,952 A | 12/1999 | Klippel | |
| 6,028,947 A | 2/2000 | Faraone et al. | |
| 6,059,926 A | 5/2000 | Hiroshima | |
| 6,275,592 B1 | 8/2001 | Vartiainen | |
| 7,013,011 B1 | 3/2006 | Weeks et al. | |
| 7,024,014 B1 | 4/2006 | Noll | |
| 7,197,443 B2 | 3/2007 | Manrique et al. | |
| 7,348,908 B2 | 3/2008 | Slavin | |
| 7,359,519 B2 | 4/2008 | Lee et al. | |
| 7,372,966 B2 | 5/2008 | Bright | |
| 7,467,071 B2 | 12/2008 | Manrique | |
| 7,477,751 B2 | 1/2009 | Lyon et al. | |
| 7,686,129 B2 | 3/2010 | Delgado, Jr. et al. | |
| 7,688,984 B2 | 3/2010 | De Callafon | |
| 8,073,149 B2 | 12/2011 | Kuze | |
| 8,086,956 B2 | 12/2011 | Su et al. | |
| 8,130,994 B2 | 3/2012 | Button et al. | |
| 8,146,989 B2 | 4/2012 | Godiska et al. | |
| 8,204,210 B2 | 6/2012 | van de Laar et al. | |
| 8,300,837 B2 | 10/2012 | Shmunk | |
| 8,391,498 B2 | 3/2013 | Potard | |
| 8,538,040 B2 | 9/2013 | Kirn | |
| 8,548,184 B2 | 10/2013 | Werner et al. | |
| 8,577,047 B2 | 11/2013 | Gautama | |
| 8,712,065 B2 | 4/2014 | Solgaard et al. | |
| 8,855,322 B2 | 10/2014 | Ryu et al. | |
| 8,938,084 B2 | 1/2015 | Arai | |
| 9,042,561 B2 | 5/2015 | Gautama et al. | |
| 9,130,527 B2 | 9/2015 | Potard | |
| 9,154,101 B2 | 10/2015 | Dhuyvetter | |
| 9,161,126 B2 | 10/2015 | Su et al. | |
| 9,374,634 B2 | 6/2016 | Macours et al. | |
| 9,432,771 B2 | 8/2016 | Oyetunji et al. | |
| 9,553,554 B2 | 1/2017 | Kimura et al. | |
| 9,578,416 B2 | 2/2017 | Gautama et al. | |
| 9,635,454 B2 | 4/2017 | Larrien | |
| 9,661,428 B2 | 5/2017 | Holladay et al. | |
| 9,693,148 B1 | 6/2017 | Lopez et al. | |
| 9,813,812 B2 | 11/2017 | Berthelsen et al. | |
| 9,837,971 B2 | 12/2017 | Luo et al. | |
| 9,883,305 B2 | 1/2018 | Risberg et al. | |
| 9,900,690 B2 | 2/2018 | Risberg et al. | |
| 9,924,249 B2 | 3/2018 | Sprinkle et al. | |
| 9,967,652 B2 | 5/2018 | Baird et al. | |
| 9,980,068 B2 | 5/2018 | Berthelsen et al. | |
| 9,992,571 B2 | 6/2018 | Hu | |
| 10,219,090 B2 | 2/2019 | Adams et al. | |
| 10,382,860 B2 | 8/2019 | Spillmann et al. | |
| 10,462,565 B2 | 10/2019 | Brunet et al. | |
| 10,542,361 B1 | 1/2020 | Lazar et al. | |
| 2002/0141098 A1 | 10/2002 | Schlager | |
| 2003/0076875 A1 | 4/2003 | Oates | |
| 2003/0076975 A1 | 4/2003 | Stead et al. | |
| 2003/0142832 A1* | 7/2003 | Meerkoetter | H04R 29/003 |
| | | | 381/59 |
| 2004/0028242 A1 | 2/2004 | Kitamura | |
| 2005/0122166 A1 | 6/2005 | Premakanthan et al. | |
| 2006/0274904 A1 | 12/2006 | Lashkari | |
| 2007/0098190 A1 | 5/2007 | Song et al. | |
| 2008/0175397 A1 | 7/2008 | Holman et al. | |
| 2009/0180636 A1 | 7/2009 | Su et al. | |
| 2010/0092004 A1 | 4/2010 | Kuze | |
| 2012/0203526 A1 | 8/2012 | Bai et al. | |
| 2012/0288118 A1 | 11/2012 | Gautama et al. | |
| 2012/0289809 A1 | 11/2012 | Kaib et al. | |
| 2013/0094657 A1 | 4/2013 | Brammer et al. | |
| 2014/0051483 A1 | 2/2014 | Schoerkmaier | |
| 2014/0254827 A1 | 9/2014 | Bailey et al. | |
| 2014/0286500 A1 | 9/2014 | Iwamoto et al. | |
| 2015/0010168 A1 | 1/2015 | Cheng et al. | |
| 2015/0010171 A1 | 1/2015 | Pernici et al. | |
| 2015/0036831 A1 | 2/2015 | Klippel | |
| 2015/0208175 A1 | 7/2015 | Pinkerton et al. | |
| 2015/0281844 A1 | 10/2015 | Stabile | |
| 2015/0319529 A1 | 11/2015 | Klippel et al. | |
| 2016/0134982 A1 | 5/2016 | Iyer | |
| 2016/0323685 A1* | 11/2016 | Iyer | H03G 11/00 |
| 2016/0345114 A1 | 11/2016 | Hanna et al. | |
| 2016/0360331 A1 | 12/2016 | Yeh | |
| 2016/0366515 A1 | 12/2016 | Mendes et al. | |
| 2016/0373858 A1 | 12/2016 | Lawrence et al. | |
| 2017/0055067 A1 | 2/2017 | Moro et al. | |
| 2017/0188150 A1 | 6/2017 | Brunet et al. | |
| 2017/0243111 A1 | 8/2017 | Iyer et al. | |
| 2017/0272045 A1 | 9/2017 | Chadha | |
| 2017/0280240 A1 | 9/2017 | Hu | |
| 2017/0318388 A1 | 11/2017 | Risberg et al. | |
| 2017/0325019 A1 | 11/2017 | Bezzolla et al. | |
| 2017/0345438 A1 | 11/2017 | Thyssen | |
| 2018/0014120 A1 | 1/2018 | Lawrence et al. | |
| 2018/0034430 A1 | 2/2018 | Ahmed et al. | |
| 2018/0054671 A1 | 2/2018 | Voishvillo et al. | |
| 2018/0132049 A1 | 5/2018 | Risberg et al. | |
| 2018/0192192 A1 | 7/2018 | Brunet et al. | |
| 2018/0206049 A1 | 7/2018 | Wendell et al. | |
| 2019/0222939 A1 | 7/2019 | Brunet et al. | |
| 2019/0281385 A1 | 9/2019 | Brunet et al. | |
| 2020/0083853 A1 | 3/2020 | Brunet et al. | |
| 2021/0120336 A1* | 4/2021 | Ritter | H04R 7/00 |

FOREIGN PATENT DOCUMENTS

| | | | |
|---|---|---|---|
| EP | 1799013 B1 | 2/2010 | |
| EP | 2369852 A | 9/2011 | |
| EP | 2642769 A1 | 9/2013 | |
| EP | 3079375 A1 | 10/2016 | |
| JP | 3433342 B2 | 8/2003 | |
| JP | 2004312141 A | 11/2004 | |
| JP | 2005129977 A | 5/2005 | |
| JP | 2007060648 A | 3/2007 | |
| JP | 2007081815 A | 3/2007 | |
| JP | 2015082754 A | 4/2015 | |
| JP | 2015084499 A | 4/2015 | |
| JP | 6182869 B2 | 8/2017 | |
| KR | 10-20050023841 A | 3/2005 | |
| KR | 10-20130001162 | 1/2013 | |
| KR | 10-20140097874 A | 8/2014 | |
| KR | 101445186 B1 | 10/2014 | |
| KR | 101770355 B1 | 8/2017 | |
| WO | 2013182901 A | 12/2013 | |
| WO | 2014045123 A | 3/2014 | |
| WO | 2015143127 A | 9/2015 | |
| WO | 2015191691 A1 | 12/2015 | |
| WO | 2017088876 A1 | 6/2017 | |

OTHER PUBLICATIONS

Thomsen, S. et al., "Design and Analysis of a Flatness-Based Control Approach for Speed Control of Drive Systems with Elastic Couplings and Uncertain Loads," Proceedings of the 2011-2014th European Conference (EPE 2011), Aug. 30, 2001 Sep. 2011, pp. 1-10, IEEE Press, United States.

Fleiss, M. et al., "Flatness and Defect of Nonlinear Systems: Introductory Theory and Examples", International Journal of Control, Jun. 1995, pp. 1327-1361, vol. 61, Taylor & Francis, United Kingdom.

Papazoglou, N. et al., "Linearisation par Asservissement d'unhautparleur electrodynamique: approche par les Systemes Hamiltoniens a Ports", Memoire De Fin D Etude M2R SAR Parcourt ATIAM, pp. 1-52, Aug. 11, 2014.

International Search Report and Written Opinion dated Mar. 31, 2017 for International Application PCT/KR2016/015435 from Korean Intellectual Property Office, pp. 1-12, Republic of Korea.

International Search Report and Written Opinion dated Apr. 20, 2018 for International Application PCT/KR2018/000016 from Korean Intellectual Property Office, pp. 1-5, Republic of Korea.

Extended European Search Report dated Jul. 23, 2018 for European Application No. 16882101.5 from European Patent Office, pp. 1-8, Munich, Germany.

(56) References Cited

OTHER PUBLICATIONS

Hu, Y. et al., "Effects of the Cone and Edge on the Acoustic Characteristics of a Cone Loudspeaker", Advances in Acoustics and Vibration, May 21, 2017, pp. 1-12, vol. 2017, Hindawi, Japan.
Salvatti, A. et al., "Maximizing performance from loudspeaker ports," Journal of the Audio Engineering Society, Jan./Feb. 2002, pp. 19-45, v. 50, No. 1/2, United States.
International Search Report and Written Opinion dated Apr. 29, 2019 for International Application PCT/KR2019/000702 from Korean Intellectual Property Office, pp. 1-10, Republic of Korea.
International Search Report and Written Opinion dated May 7, 2019 for International Application PCT/KR2019/001090 from Korean Intellectual Property Office, pp. 1-13, Republic of Korea.
International Search Report dated Jun. 21, 2019 for International Application PCT/KR2019/002741 from Korean Intellectual Property Office, pp. 1-3, Republic of Korea.
European Office Action dated Nov. 15, 2019 for European Application No. 16882101.5 from European Patent Office, pp. 1-6, Munich, Germany.
Chinese Office Action dated Dec. 5, 2019 for Chinese Patent Application No. 201680076647.X from Chinese Patent Office, pp. 1-21, Beijing, China (English-language translation included pp. 1-14).
Extended European Search Report dated Nov. 21, 2019 for European Application No. 18736189.4 from European Patent Office, pp. 1-7, Munich.
Schurer, H. et al., "Theoretical and experimental comparison of three methods for compensation of electrodynamic transducer non-linearity.", Journal of the Audio Engineering Society, Sep. 1, 1998, vol. 46, No. 9, pp. 723-740, The Netherlands.
International Search Report and Written Opinion dated Dec. 23, 2019 for International Application PCT/KR2019/011591 from Korean Intellectual Property Office, pp. 1-9, Republic of Korea.
International Search Report and Written Opinion dated Dec. 23, 2019 for International Application PCT/KR2019/011200 from Korean Intellectual Property Office, pp. 1-12, Republic of Korea.
Henwood, D.J. et al., "The Boundary-Element Method and Horn Design", Journal of the Audio Engineering Society, Jun. 1, 1993, vol. 41, No. 6, pp. 485-496.
U.S. Non-Final Office Action for U.S. Appl. No. 15/391,633 dated Mar. 28, 2019.
U.S. Notice of Allowance for U.S. Appl. No. 15/391,633 dated Sep. 18, 2019.
U.S. Corrected Notice of Allowability for U.S. Appl. No. 15/391,633 dated Dec. 12, 2019.
U.S. Non-Final Office Action for U.S. Appl. No. 15/835,245 dated Jun. 14, 2018.
U.S. Final Office Action for U.S. Appl. No. 15/835,245 dated Jan. 10, 2019.
U.S. Advisory Action for U.S. Appl. No. 15/835,245 dated Apr. 11, 2019.
U.S. Notice of Allowance for U.S. Appl. No. 15/835,245 dated May 6, 2019.
U.S. Supplemental Notice of Allowability for U.S. Appl. No. 15/835,245 dated Jul. 15, 2019.
U.S. Supplemental Notice of Allowability for U.S. Appl. No. 5/835,245 dated Aug. 28, 2019.
U.S. Supplemental Notice of Allowability for U.S. Appl. No. 15/835,245 dated Oct. 1, 2019.
U.S. Notice of Allowance for U.S. Appl. No. 15/873,530 dated Jul. 18, 2019.
U.S. Notice of Allowability for U.S. Appl. No. 15/873,530 dated Aug. 28, 2019.
U.S. Notice of Allowability for U.S. Appl. No. 15/873,530 dated Sep. 9, 2019.
U.S. Corrected Notice of Allowability for U.S. Appl. No. 15/873,530 dated Oct. 18, 2019.
U.S. Corrected Notice of Allowability for U.S. Appl. No. 15/873,530 dated Nov. 12, 2019.
U.S. Notice of Allowance for U.S. Appl. No. 16/057,711 dated Apr. 2, 2019.
U.S. Notice of Allowance for U.S. Appl. No. 16/057,711 dated Sep. 17, 2019.
U.S. Non-Final Office Action for U.S. Appl. No. 16/224,604 dated Oct. 22, 2019.
U.S. Notice of Allowance for U.S. Appl. No. 16/224,604 dated Feb. 13, 2020.
U.S. Non-Final Office Action for U.S. Appl. No. 16/391,081 dated Mar. 31, 2020.
U.S. Notice of Allowance for U.S. Appl. No. 16/391,081 dated May 27, 2020.
U.S. Non-Final Office Action for U.S. Appl. No. 16/457,619 dated May 15, 2020.
U.S. Supplemental Notice of Allowability for U.S. Appl. No. 16/391,081 dated Jul. 29, 2020.
U.S. Final Office Action for U.S. Appl. No. 16/457,619 dated Oct. 21, 2020.
International Search Report & Written Opinion dated Feb. 7, 2022 for International Application PCT/KR2021/015055 from Korean Intellectual Property Office, pp. 1-7, Republic of Korea.

\* cited by examiner

NONLINEAR CONTROL OF A LOUDSPEAKER WITH A NEURAL NETWORK

TECHNICAL FIELD

One or more embodiments relate generally to loudspeakers, and in particular, nonlinear control of a loudspeaker with a neural network.

BACKGROUND

A loudspeaker produces sound when connected to an integrated amplifier, a television (TV) set, a radio, a music player, an electronic sound producing device (e.g., a smartphone, a computer), a video player, etc.

SUMMARY

One embodiment provides a method comprising inputting into a first layer of a neural network at least one data sample of a current displacement of one or more moving components of a loudspeaker and at least one or more other data samples of one or more prior displacements of the one or more moving components. The method further comprises generating in the first layer a data vector by applying a nonlinear activation function based on the at least one data sample of the current displacement and the at least one or more other data samples of the one or more prior displacements. The method further comprises inputting into a second layer of the neural network the data vector. The second layer applies an affine transformation (e.g., linear combination) to the data vector. The method further comprises outputting a prediction of a current voltage to apply to the loudspeaker based on the affine transformation applied to the data vector in the second layer.

These and other features, aspects, and advantages of the one or more embodiments will become understood with reference to the following description, appended claims, and accompanying figures.

DETAILED DESCRIPTION

Figure 1:
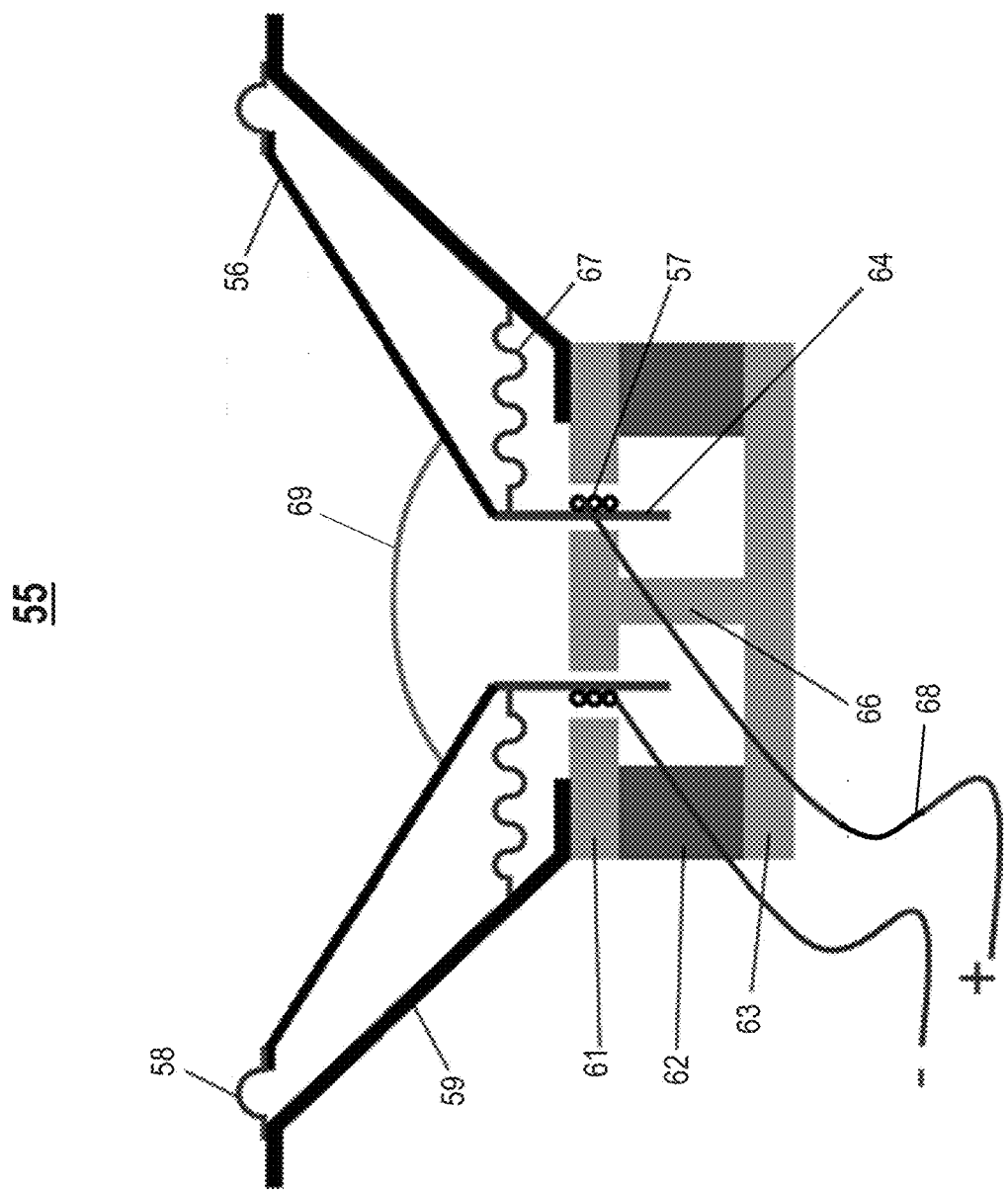
FIG. 1 illustrates a cross section of an example speaker driver.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, nonlinear control of a loudspeaker with a neural network. One embodiment provides a method comprising inputting into a first layer of a neural network at least one data sample of a current displacement of one or more moving components of a loudspeaker and at least one or more other data samples of one or more prior displacements of the one or more moving components. The method further comprises generating in the first layer a data vector by applying a nonlinear activation function based on the at least one data sample of the current displacement and the at least one or more other data samples of the one or more prior displacements. The method further comprises inputting into a second layer of the neural network the data vector. The second layer applies an affine transformation (e.g., linear combination) to the data vector. The method further comprises outputting a prediction of a current voltage to apply to the loudspeaker based on the affine transformation applied to the data vector in the second layer. In some embodiments, the affine transformation includes a linear combination. In some embodiments, the affine transformation includes a linear combination and/or bias. In some embodiments (e.g., during a deployment/inference/running phase), an input source data (e.g., music, speech, etc.) can be received into the neural network that is trained, and a target displacement of the loudspeaker for the input source data can be determined based on the prediction of the current (adequate) voltage that will yield the target displacement.

For expository purposes, the terms "loudspeaker", "loudspeaker device", and "loudspeaker system" may be used interchangeably in this specification.

For expository purposes, the terms "displacement" and "excursion" may be used interchangeably in this specification.

Controlling displacement of a diaphragm (i.e., membrane) of a loudspeaker during audio reproduction enables the loudspeaker to produce loud audio (i.e., sounds) with good bass extension and low audio distortion, and ensures protection of the loudspeaker (i.e., secure operation).

A loudspeaker comprises a diaphragm (i.e., membrane) and a linear electric motor connected to the diaphragm. The motor utilizes voltage to move the diaphragm, resulting in soundwaves (i.e., airwaves that reproduce sound).

Controlling a loudspeaker to reproduce a given (i.e., desired) sound signal involves determining a desired (i.e., target) displacement (i.e., excursion) of a diaphragm of the loudspeaker based on acoustic principles, and controlling actual displacement of the diaphragm to obtain the target displacement of the diaphragm, resulting in the reproduction of the sound signal. Controlling the actual displacement of the diaphragm may involve determining voltage (i.e., input control voltage) to be applied to the loudspeaker to obtain the target displacement of the diaphragm. An exact mapping (i.e., relationship) between displacement of a diaphragm of a loudspeaker and voltage is dynamic, nonlinear, time-varying, and complex as it is difficult to model the mapping exactly, and the mapping is specific to the loudspeaker and its enclosure.

Conventional solutions for nonlinear control of loudspeakers are complex and difficult to implement, setup, and operate (i.e., run). For example, precision of some conventional solutions is limited because these solutions utilize insufficient physical models that do not completely capture complexities of loudspeaker (i.e., audio) systems, such as unknown dynamics, level and time dependent characteristics, unknown nonlinearities. Furthermore, determining and/or measuring parameters of loudspeakers is difficult, limited in precision, and requires special equipment and expertise.

One or more embodiments provide method and system for nonlinear control of a loudspeaker with a neural network. The neural network is a neural network that has been trained to learn the mapping between voltage and displacement of one or more moving components (e.g., diaphragm) of the loudspeaker. In one embodiment, a deployment phase is implemented that involves utilizing the neural network to determine an input control voltage to be applied to the loudspeaker during audio reproduction of a given audio program material to obtain a target displacement of the one or more moving components of the loudspeaker. In one embodiment, the target displacement is determined utilizing linear filtering (e.g., band-limited double integration), the target displacement is fed to the neural network to obtain the input control voltage, and the input control voltage is applied to the loudspeaker to reproduce the audio program material. Unlike conventional solutions, embodiments of the invention are non-complex and simple to implement, setup, and operate.

One or more embodiments provide a loudspeaker system for nonlinear control of a loudspeaker with a neural network. In one embodiment, the loudspeaker system is configured to implement both a training phrase and a deployment phase. In one embodiment, during the training phase, the loudspeaker system is configured to train the neural network to learn the mapping between voltage and displacement of one or more moving components (e.g., diaphragm) of the loudspeaker. In one embodiment, during the deployment phase, the loudspeaker system is configured to determine a target displacement of the one or more moving components that is required to reproduce a given audio program material, and utilize the trained neural network resulting from the training phase to determine an input control voltage to apply to the loudspeaker to obtain the target displacement. In one embodiment, the loudspeaker system includes one or more other components such as, but not limited to, an amplifier, a compressor and/or limiter, DSP, etc.

A loudspeaker device includes at least one speaker driver for reproducing sound. FIG. 1 illustrates a cross section of an example speaker driver 55. The speaker driver 55 comprises one or more moving components, such as a diaphragm (i.e., membrane) 56 (e.g., a cone-shaped diaphragm), a driver voice coil 57, a former 64, and a protective cap 69 (e.g., a dome-shaped dust cap). The speaker driver 55 further comprises one or more of the following components: (1) a surround roll 58 (e.g., suspension roll), (2) a basket 59, (3) a top plate 61, (4) a magnet 62, (5) a bottom plate 63, (6) a pole piece 66, (7) a spider 67, and (8) terminals 68 (e.g., a positive terminal and a negative terminal).

Figure 2A:
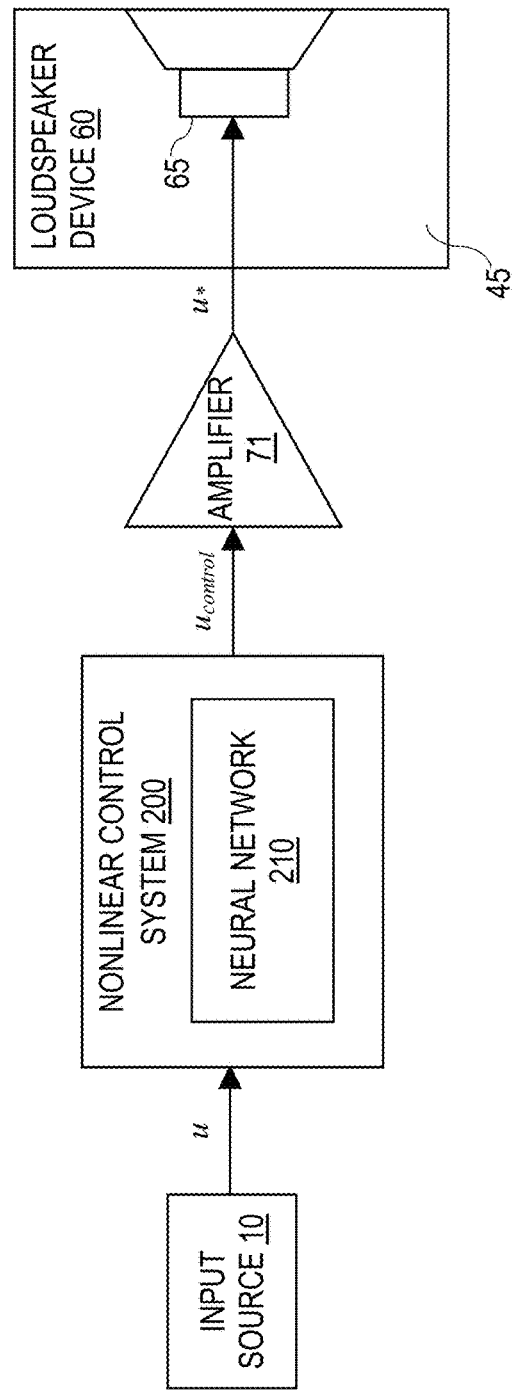
FIG. 2A illustrates an example loudspeaker system, in accordance with an embodiment.

FIG. 2A illustrates an example loudspeaker system 100, in accordance with an embodiment. The loudspeaker system 100 comprises a loudspeaker device 60. The loudspeaker device 60 comprises a loudspeaker enclosure 45 including at least one speaker driver 65 for reproducing sound. The speaker driver 65 may be any type of speaker driver such as, but not limited to, a forward-facing speaker driver, an upward-facing speaker driver, a downward-facing speaker driver, etc. In one embodiment, the speaker driver 55 in FIG. 1 is an example implementation of the speaker driver 65. The speaker driver 65 comprises one or more moving components, such as a diaphragm 56 (FIG. 1), a driver voice coil 57 (FIG. 1), a protective cap 69 (FIG. 1), and/or a former 64.

The loudspeaker system 100 comprises a nonlinear control system 200. The nonlinear control system 200 is a controller configured to implement nonlinear control of the loudspeaker device 60 with a neural network 210.

In one embodiment, the nonlinear control system 200 is configured to receive, as input, a source signal (e.g., an input signal such as an input audio signal) from an input source 10 for audio reproduction via the loudspeaker device 60. For example, in one embodiment, the source signal comprises audio program material (e.g., media content, such as music, speech, etc.). In one embodiment, the nonlinear control system 200 is configured to receive a source signal from different types of input sources 10. Examples of different types of input sources 10 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc. Let u generally denote an input voltage of a source signal.

As described in detail later herein, in response to receiving a source signal for audio reproduction via the loudspeaker device 60, the nonlinear control system 200 is configured to: (1) determine a target displacement of the one or more moving components (e.g., the diaphragm 56, the driver voice coil 57, the protective cap 69, and/or the former 64) of the loudspeaker device 60 that is required to reproduce the source signal, and (2) utilize the neural network 200 to determine an input control voltage $u_{control}$ to apply to the loudspeaker device 60 during the audio reproduction of the source signal to obtain the target displacement.

In one embodiment, the loudspeaker system 100 comprises a voltage source amplifier 71 connected to the loudspeaker device 60 and the nonlinear control system 200. The voltage source amplifier 71 is a power amplifier configured to output (i.e., apply or produce), for each sampling time t, an actual voltage (i.e., applied voltage) u* based on an input control voltage $u_{control}$ determined by the nonlinear control system 200 at the sampling time t. The input control voltage $u_{control}$ controls the voltage source amplifier 71, directing the voltage source amplifier 71 to output an amount of voltage that is substantially the same as the input control voltage $u_{control}$. The speaker driver 65 is driven by the actual voltage u* output by the voltage source amplifier 71, thereby amplifying the source signal for audio reproduction via the loudspeaker device 60. Therefore, the nonlinear control system 200 controls displacement of the one or more moving components of the loudspeaker device 60 during the audio reproduction of the source signal by performing control via the input control voltage $u_{control}$ that is based on the target displacement.

The nonlinear control system 200 facilitates a higher level of audio reproduction, with improved sound quality, and additional control of the loudspeaker device 60.

In one embodiment, the loudspeaker system 100 includes one or more other components such as, but not limited to, an amplifier, a compressor and/or limiter, DSP, etc. For example, in one embodiment, the nonlinear control system 200 is combined with an excursion limiter and/or a voltage limiter (e.g., implemented by the limiter 110 (FIG. 2B)) to protect the loudspeaker device 60.

In one embodiment, the loudspeaker system 100 may be integrated in different types of electrodynamic transducers with a broad range of applications such as, but not limited to, the following: computers, televisions (TVs), smart devices (e.g., smart TVs, smart phones, etc.), soundbars, subwoofers, wireless and portable speakers, mobile phones, car speakers, etc.

Figure 2B:
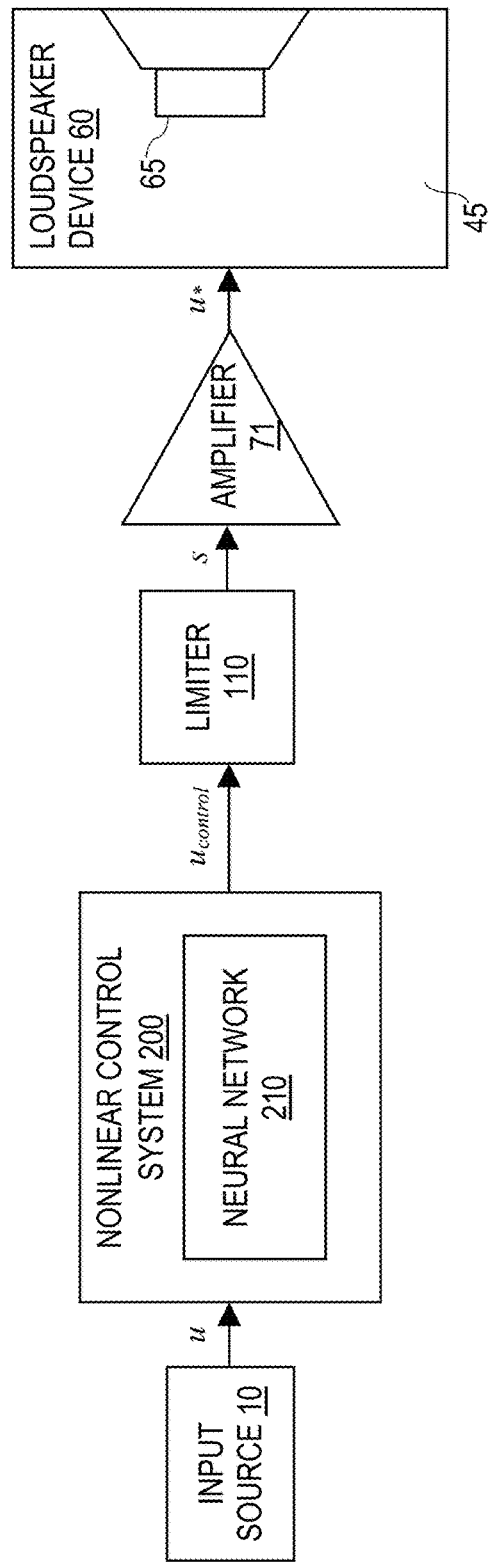
FIG. 2B illustrates another example loudspeaker system, in accordance with an embodiment.

FIG. 2B illustrates another example loudspeaker system 105, in accordance with an embodiment. The loudspeaker system 105 comprises the same components as the loudspeaker system 100 in FIG. 2A and a limiter 110 for linear or nonlinear control of the loudspeaker device 60. For example, in one embodiment, the limiter 110 is an additional nonlinear control system configured to provide correction of nonlinear audio distortion by pre-distorting voltage applied to the loudspeaker device 60. The limiter 110 is configured to receive, as input, an input control voltage $u_{control}$ at a sampling time t (e.g., from the nonlinear control system 200), and generate and transmit a control signal s specifying a target voltage (e.g., a target voltage that produces a target displacement of the one or more moving components of the loudspeaker device 60 at the sampling time t). The control signal s can be any type of signal such as, but not limited to, a current, a voltage, a digital signal, an analog signal, etc. In one embodiment, the voltage source amplifier 71 is configured to output an actual voltage u* at a sampling time t based on a control signal s from the limiter 110, wherein the control signal s directs the voltage source amplifier 71 to output an amount of voltage that is substantially the same as a target voltage included in the control signal s for the sampling time t.

Let x generally denote a displacement of one or more moving components (e.g., the diaphragm 56, the driver voice coil 57, the protective cap 69, and/or the former 64) of a loudspeaker device 60, let $\dot{x}$ generally denote a velocity (i.e., first time derivative of the displacement x) of the one or more moving components, let $\ddot{x}$ generally denote an acceleration (i.e., second time derivative of the displacement x) of the one or more moving components, and let $\dddot{x}$ generally denote a third time derivative of the displacement x.

Figure 3:
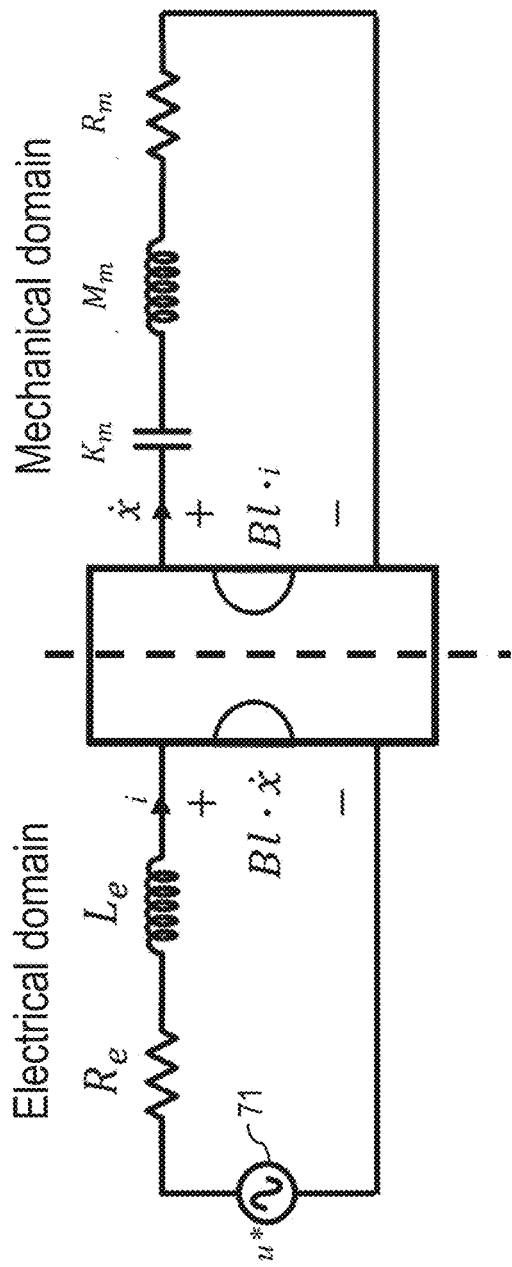
FIG. 3 illustrates an example electroacoustic model for a loudspeaker device driven by a voltage source amplifier.

FIG. 3 illustrates an example electroacoustic model 70 for a loudspeaker device 60 (FIGS. 2A, 2B) driven by a voltage source amplifier 71. One or more loudspeaker parameters (i.e., loudspeaker characteristics) for the loudspeaker device 60 may be classified into one of the following domains: an electrical domain or a mechanical domain. In the electrical domain, examples of different loudspeaker parameters include, but are not limited to, the following: (1) an applied voltage u* from the voltage source amplifier 71 for driving a speaker driver 65 of the loudspeaker device 60, (2) an electrical resistance $R_e$ of a driver voice coil 57 of the speaker driver 65, (3) a current i flowing through the driver voice coil 57 as a result of the applied voltage u*, (4) an inductance $L_e$ of the driver voice coil 57, and (5) a back electromagnetic force (back EMF) Bl·$\dot{x}$ resulting from the motion of the driver voice coil 57 in the magnetic field of the motor structure (i.e., driver voice coil 57, top plate 61, magnet 62, bottom plate 63, and pole piece 66) of the speaker driver 65, wherein the back-EMF Bl·$\dot{x}$ represents a product of a force factor Bl of the motor structure and a velocity x of one or more moving components of the speaker driver 65 (e.g., the diaphragm 56, the driver voice coil 57, the protective cap 69, and/or the former 64).

In the mechanical domain, examples of different loudspeaker parameters include, but are not limited to, the following: (1) the velocity x of the one or more moving components of the speaker driver 65, (2) a mechanical mass $M_m$ of the one or more moving components (i.e., moving mass) and air load, (3) a mechanical resistance $R_m$ representing the mechanical losses of the speaker driver 65, (4) a stiffness factor $K_m$ of the suspension (i.e., surround roll 58, spider 67, plus air load) of the speaker driver 65, and (5) a mechanical force Bl·i applied on the one or more moving components, wherein the mechanical force Bl·i represents a product of the force factor Bl of the motor structure and the current i flowing through the driver voice coil 57.

Nonlinear dynamics for the loudspeaker device 60 may be represented in accordance with equations (1)-(2) provided below. Specifically, a current i flowing through the driver voice coil 57 may be represented in accordance with equation (1) provided below:

$$i=(M_m\ddot{x}+K_m(x)x+R_m\dot{x})/Bl(x)=\varphi_i(x,\dot{x},\ddot{x}) \qquad (1),$$

wherein equation (1) represents a mechanical equation for the speaker driver 65.

An applied voltage u* present at the terminals (e.g., terminals 68) of the speaker driver 65 may be expressed as a function of a displacement x of the one or more moving components (e.g., the diaphragm 56, the driver voice coil 57, the protective cap 69, and/or the former 64) of the loudspeaker device 60, its time derivatives (i.e., $\dot{x}$, $\ddot{x}$, and $\dddot{x}$), and the loudspeaker parameters for the loudspeaker device 60. Specifically, an applied voltage u* present at the terminals (e.g., terminals 68) of the speaker driver 65 may be represented in accordance with equation (2) provided below:

$$u^*=Bl(x)\dot{x}+R_e i+\partial\{L_e(x)i\}/\partial t=\varphi_u(x,\dot{x},\ddot{x},\dddot{x}) \qquad (2),$$

wherein equation (2) represents an electrical equation for the speaker driver 65.

In the digital domain, $n^{th}$-order derivatives are approximated by combining past samples. Let $x_k^{(2)}$ generally denote an approximation of a second derivative of $x_k$. The approximation $x_k^{(2)}$ may be represented in accordance with equation (3) provided below:

$$x_k^{(2)} = \frac{1}{T_s^2}[x_k - 2x_{k-1} + x_{k-2}], \quad (3)$$

wherein $T_s$ is a sampling period.

In the digital domain, voltage samples are a function of past displacement samples, as represented in accordance with equation (4) provided below:

$$u_k = \Psi_u(x_k, x_{k-1}, \ldots x_{k-3}) \quad (4),$$

wherein $\Psi_u$ is a nonlinear multivariate function for a loudspeaker device that maps past displacement values of one or more moving components of the loudspeaker device to voltage. The nonlinear multivariate function $\Psi_u$ is specific to the loudspeaker device, difficult to model, and parametrize.

To approximate the relationship between voltage and displacement of one or more moving components of a loudspeaker device, some conventional solutions utilize a theoretical, simplified model of the loudspeaker device that is based on a theoretical assumption represented by equation (4) provided above. The model depends on nonlinear loudspeaker parameters for the loudspeaker device that are difficult to estimate as complex measurement equipment and high-level expertise (e.g., from a professional, such as an engineer) are required.

In one embodiment, the nonlinear control system 200 utilizes the neural network 210 and input-output data to determine the relationship between voltage and displacement of the one or more moving components of the loudspeaker device 60, thereby removing the need to utilize a theoretical, simplified model of the loudspeaker. Unlike some conventional solutions where complex measurement equipment and high-level expertise are required to estimate nonlinear loudspeaker parameters for a loudspeaker device, the nonlinear control system 200 provides increased accuracy with simplified measurements.

Let y(t) generally denote a voltage sample recorded (i.e., measured) at a loudspeaker device 60 at sampling time t, and let x(t) generally denote a displacement sample recorded at the loudspeaker device 60 at sampling time t.

Figure 4:
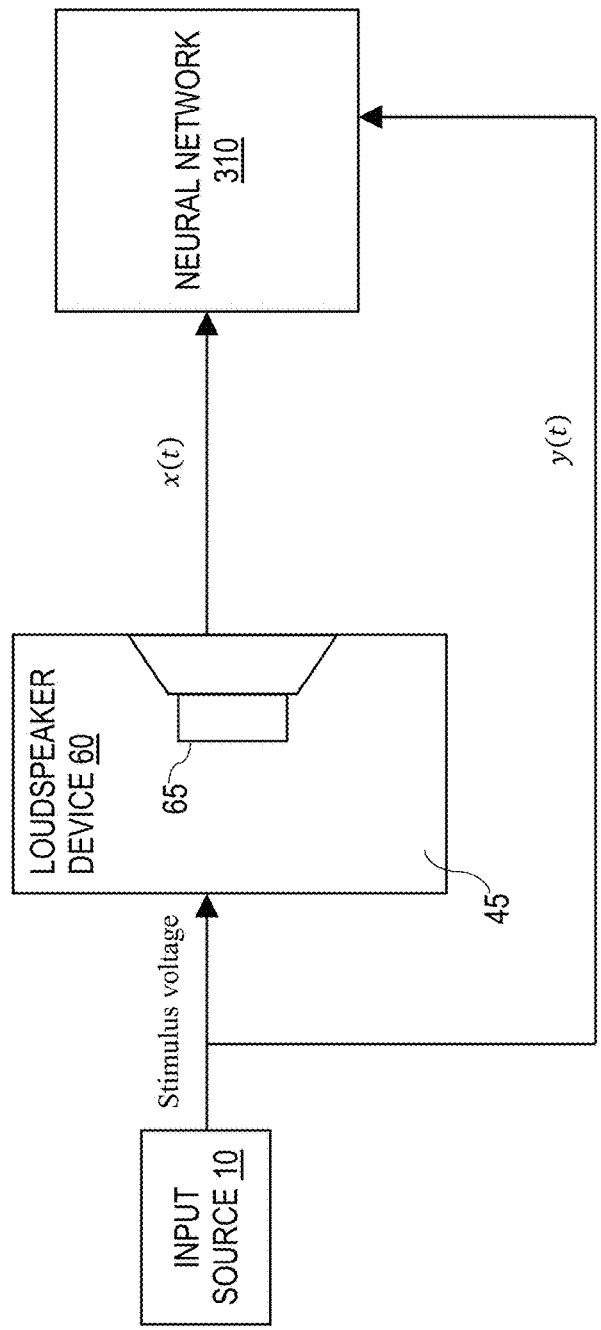
FIG. 4 illustrates an example training system for training a neural network to learn the relationship between voltage and displacement of one or more moving components of a loudspeaker device, in accordance with one embodiment.

FIG. 4 illustrates an example training system 300 for training a neural network 310 to learn the relationship between voltage and displacement of one or more moving components of a loudspeaker device 60, in accordance with one embodiment. In one embodiment, the training system 300 is configured to implement a training phase that involves obtaining training data comprising voltage samples y(t) and displacement samples x(t) recorded at the loudspeaker device 60, and feeding the training data to the neural network 310 to train the neural network 310 to learn the relationship between voltage and displacement of the one or more moving components (e.g., the diaphragm 56, the driver voice coil 57, the protective cap 69, and/or the former 64) of the loudspeaker device 60.

For example, in one embodiment, the training system 300 implements the training phase as follows: The training system 300 invokes the loudspeaker device 60 to play a stimulus voltage. In one embodiment, the loudspeaker device 60 receives the stimulus voltage from an input source 10. In one embodiment, the stimulus voltage has substantially similar amplitude and spectral distributions as average audio program material (e.g., media content such as music, speech, etc.) at a level that covers full range of utilization of the loudspeaker.

The training system 300 records (i.e., measures), utilizing one or more sensors (e.g., a laser sensor), voltage samples y(t) and corresponding displacement samples x(t) at the loudspeaker device 60 over time. Each displacement sample x(t) is a displacement of the one or more moving components of the loudspeaker device 60 during the audio reproduction of the stimulus voltage. In one embodiment, the one or more sensors are positioned within proximity of the one or more moving components of the loudspeaker device 60.

The training system 300 feeds the voltage samples y(t) and the displacement samples x(t) to the neural network 310 as training data, and applies a machine learning algorithm (e.g., supervised machine learning) to train the neural network 310 based on the training data. The neural network 310 is trained to learn the mapping (i.e., relationship) between voltage and displacement of the one or more moving components of the loudspeaker device 60. After the training phase, the resulting trained neural network 310 is available for deployment (i.e., to utilize in a deployment phase).

For example, in one embodiment, the trained neural network 310 is deployed as the trained neural network 210 in the nonlinear control system 200. To obtain a target displacement of the one or more moving components of loudspeaker device 60, the nonlinear control system 200 utilizes the trained neural network 310 for online inference of an input control voltage (e.g., $u_{control}$) to apply to the loudspeaker device 60 during audio reproduction of a given audio program material.

In one embodiment, the training system 300 is integrated with the nonlinear control system 200. In another embodiment, the training phase is performed offline (e.g., on a remote server). A neural network 310 that is trained offline may be downloaded to/loaded onto the nonlinear control system 200 for use as a trained neural network 210 during the deployment phase.

Figure 5:
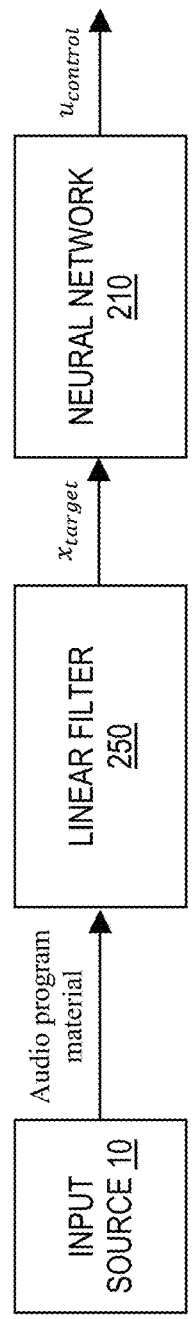
FIG. 5 illustrates an example nonlinear control system for nonlinear control of a loudspeaker device with a trained neural network, in accordance with one embodiment.

FIG. 5 illustrates an example nonlinear control system 200 for nonlinear control of a loudspeaker device 60 with a trained neural network 210, in accordance with one embodiment. In one embodiment, during a training phase, a neural network 210 is trained (e.g., via the training system 300) to learn the mapping (i.e., relationship) between voltage and displacement of one or more moving components (e.g., the diaphragm 56, the driver voice coil 57, the protective cap 69, and/or the former 64) of the loudspeaker device 60 based on training data comprising voltage samples and current samples.

In one embodiment, the nonlinear control system 200 is configured to implement a deployment phase that involves utilizing the trained neural network 210 to determine an input control voltage $u_{control}$ to apply to the loudspeaker device 60 during audio reproduction of a given audio program material to obtain a target displacement $x_{target}$ of the one or more moving components of the loudspeaker device 60.

In one embodiment, the nonlinear control system 200 comprises a linear filter 250 configured to: (1) receive, from an input source 10, a given audio program material (e.g., media content, such as music, speech, etc.) to reproduce via the loudspeaker device 60, and (2) utilize linear filtering to determine a target displacement $x_{target}$ of the one or more moving components of the loudspeaker device 60 that is required to reproduce the given audio program material. The target displacement $x_{target}$ is provided as input to the trained neural network 210.

In one embodiment, the trained neural network 210 is configured to: (1) receive (e.g., from the linear filter 250) a target displacement $x_{target}$ required to reproduce a given audio program material, and (2) determine an input control voltage $u_{control}$ to apply to the loudspeaker device 60 during the audio reproduction of the given audio program material to obtain the target displacement $x_{target}$.

Figure 6:
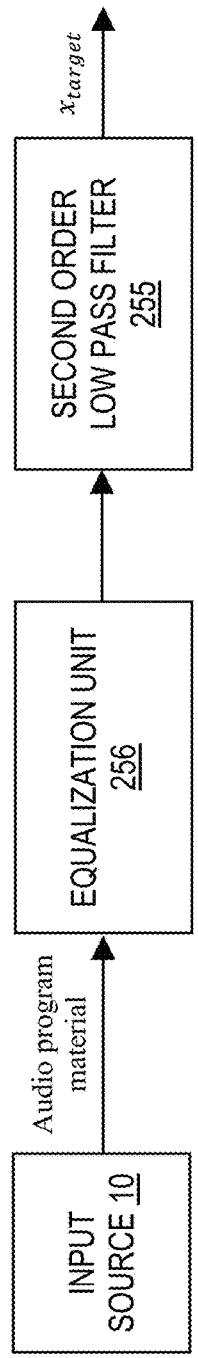
FIG. 6 illustrates an example linear filter, in accordance with an embodiment.

FIG. 6 illustrates an example linear filter 250, in accordance with an embodiment. In one embodiment, the linear filter 250 is configured to: (1) receive, from an input source 10, a given audio program material to reproduce via the loudspeaker device 60, and (2) utilize linear filtering to determine a target displacement $x_{target}$ of one or more moving components (e.g., the diaphragm 56, the driver voice coil 57, the protective cap 69, and/or the former 64) of the loudspeaker device 60 that is required to reproduce the given audio program material.

In one embodiment, the linear filter 250 performs band-limited double integration of the given audio program material to determine the target displacement $x_{target}$. For example, in one embodiment, the linear filter 250 comprises a second-order low pass (LP) filter 255 configured to perform the linear filtering. A cut-off frequency and gain of the LP filter 255 are adjustable to obtain a desired bass response from the loudspeaker device 60.

In one embodiment, the linear filter 250 comprises an optional equalization (EQ) unit 256 configured to fine tune a frequency response of the loudspeaker device 60.

Figure 7:
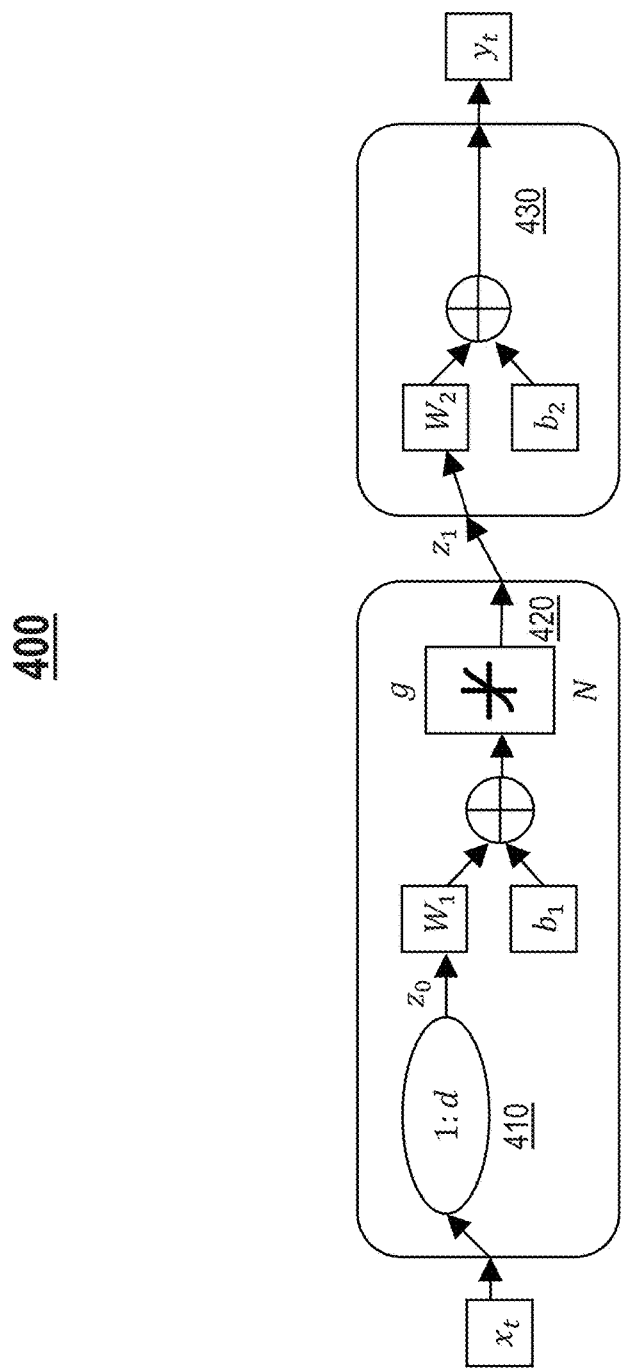
FIG. 7 illustrates an example time-delay neural network (TDNN), in accordance with an embodiment.

FIG. 7 illustrates an example time-delay neural network (TDNN) 400, in accordance with an embodiment. In one embodiment, the trained neural network 210 is a TDNN 400. The TDNN 400 comprises an input layer 410, a hidden layer 420, and an output layer 430.

In one embodiment, the input layer 410 implements equation (5) provided below:

$$z_0 = [x_{t-1}, x_{t-2}, \ldots x_{t-d}]^T \qquad (5),$$

wherein $z_0$ is an input vector of past displacement samples $x_{t-1}, x_{t-2}, \ldots x_{t-d}$, and d is a number of input delays.

In one embodiment, the hidden layer 420 implements equation (6) provided below:

$$z_1 = g(W_1 z_0 + b_1) \qquad (6),$$

wherein $z_1$ is a vector of dimensions N×1, g is a nonlinear activation function (e.g., Tan h activation function) applied element-wise, $W_1$ is a weights matrix of dimensions N×d, $b_1$ is a bias vector of dimensions N×1, and N is a number of hidden neurons with the nonlinear activation function. In some embodiments, the activation function includes a Tan h activation function, a sigmoid activation function, and/or a Rectified Linear Unit (ReLu) activation function, etc.

In one embodiment, the output layer 430 implements equation (7) provided below:

$$y_t = W_2 z_1 + b_2 \qquad (7),$$

wherein $W_2$ is a weights matrix of dimensions 1×N, $b_2$ is a bias of dimensions 1×1, and y is a scalar, estimated (i.e., predicted) voltage based on an affine transformation (e.g., linear combination).

In one embodiment, the TDNN 400 is configured to apply equations (5)-(7) in succession to obtain an estimated (i.e., predicted) voltage $y_t$ for time step t. Specifically, the TDNN 400 is configured to: (1) input a data sample of a current displacement of one or more moving components of the loudspeaker device 60 (i.e., a current displacement sample $x_t$ for current time step t, such as a target displacement $x_{target}$ from the linear filter 250) into the input layer 410, and (2) input one or more other data samples of one or more past displacements of the one or more moving components of the loudspeaker device 60 (i.e., $z_0$) into the input layer 410.

In one embodiment, the hidden layer 420 generates a data vector (i.e., $z_1$) based on a nonlinear activation function (i.e., g) applied to the data sample of the current displacement and the one or more other data samples of the one or more past displacements (i.e., in accordance with equation (6) provided above).

In one embodiment, the TDNN 400 is configured to input the data vector generated by the hidden layer 420 into the output layer 430.

In one embodiment, the output layer 430 is configured to: (1) apply an affine transformation (i.e., in accordance with equation (7) provided above) to the data vector, and (2) output a prediction of a current voltage (i.e., $y_t$) to apply to the loudspeaker device 60 based on the affine transformation applied to the data vector. In some embodiments, the affine transformation includes a linear combination. In some embodiments, the affine transformation includes a linear combination and/or bias. In some embodiments (e.g., during a deployment/inference/running phase), an input source data (e.g., music, speech, etc.) can be received into the neural network that is trained, and a target displacement of the loudspeaker for the input source data can be determined based on the prediction of the current (adequate) voltage that will yield the target displacement.

In one embodiment, all N(d+2)+1 weights of the TDNN 400 (i.e., weights of $W_2$, $b_2$, $W_1$, and $b_1$) are automatically adjusted during the training phase to reconcile differences between a target state (e.g., actual voltage) and a predicted state (e.g., estimated voltage) of the TDNN 400.

In one embodiment, the exact dimensions of the TDNN 400 (i.e., number of input delays d, number of neurons N) are tuned during the training phase. For example, in one embodiment, the number of input delays is 15, and the number of neurons is 40.

In one embodiment, the TDNN 400 utilizes a large number of past displacement samples to increase robustness of estimations and to take in account time-delays. The number of neurons N is tuned to balance accuracy and robustness of the TDNN 400.

Figure 8:
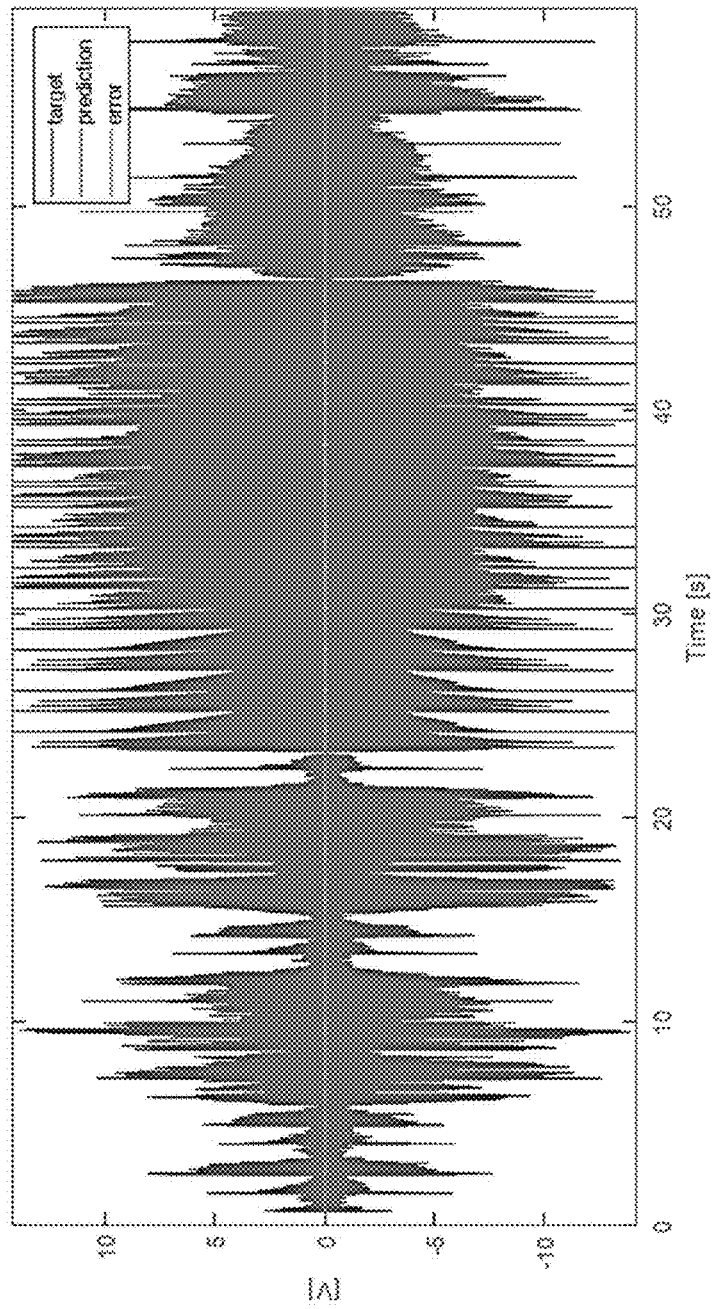
FIG. 8 is an example graph representing simulation results of the TDNN, in accordance with an embodiment.

FIG. 8 is an example graph 500 representing simulation results of the TDNN 400, in accordance with an embodiment. A horizontal axis of the graph 500 represents time in s. A vertical axis of the graph 500 represents voltage in V. The graph 500 illustrates: (1) a target voltage to apply to the loudspeaker device 60 to reproduce a sample of a given audio program material, (2) an estimated (i.e., predicted) voltage to apply to the loudspeaker device 60 to reproduce the same sample, wherein the estimated voltage is determined utilizing the TDNN 400, and (3) a relative error between the target voltage and the estimated voltage. As shown in FIG. 8, the estimated voltage substantially matches the target voltage. In one embodiment, the relative error is about 0.122%.

Figure 9:
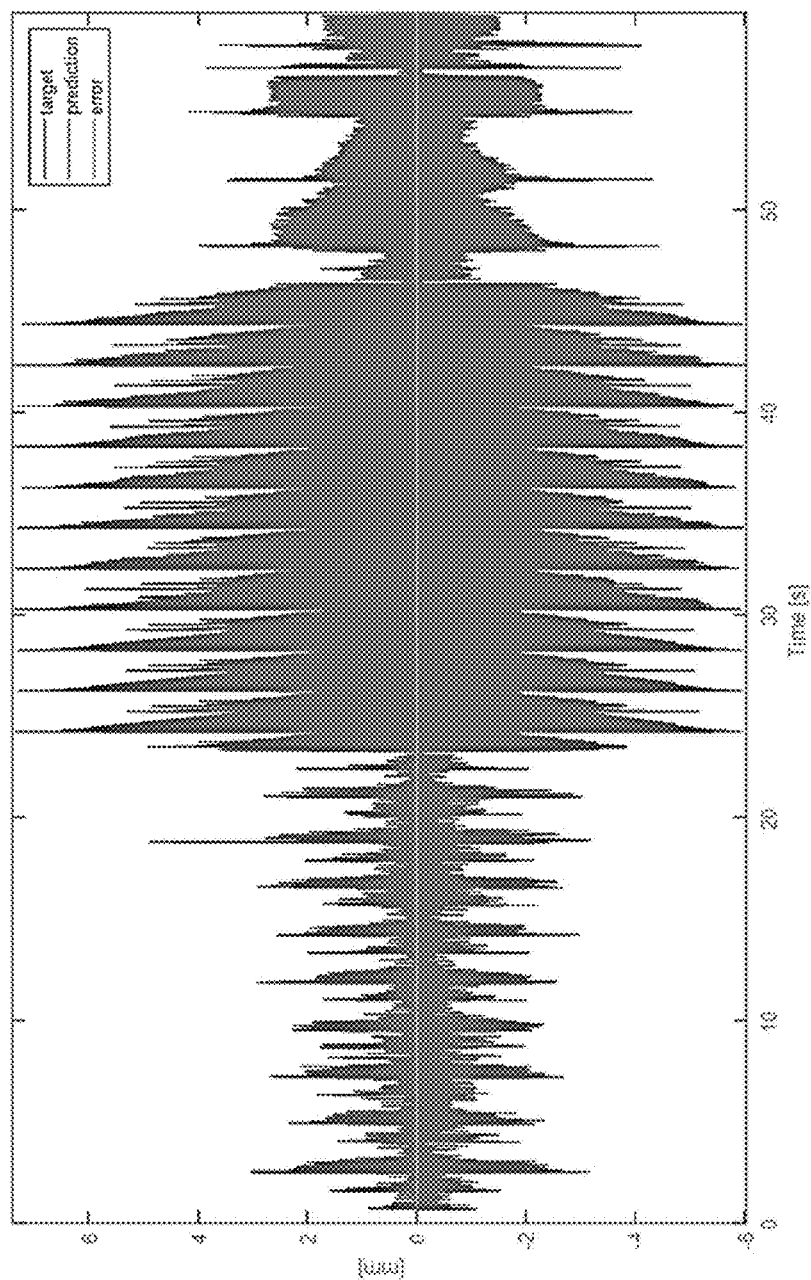
FIG. 9 is another example graph comparing excursions, in accordance with an embodiment.

FIG. 9 is another example graph 510 comparing excursions, in accordance with an embodiment. A horizontal axis of the graph 510 represents time in s. A vertical axis of the graph 510 represents excursion (i.e., displacement) in mm. The graph 510 illustrates: (1) a target excursion of one or more moving components of the loudspeaker device 60 when a target voltage is applied to the loudspeaker device 60 to reproduce a sample of a given audio program material, (2) an estimated (i.e., predicted) excursion of the one or more moving components of the loudspeaker device 60 when an estimated voltage is applied to the loudspeaker device 60 to reproduce the same sample, wherein the estimated voltage applied is the same as the predicted voltage shown in FIG. 8, and (3) a relative error between the target excursion and the estimated excursion. As shown in FIG. 9, the estimated excursion substantially matches the target excursion. In one embodiment, the relative error is about 0.207%. Therefore, the estimated voltage determined via the TDNN 400 is accurate and can be used to precisely control displacement of the one or more moving components of the loudspeaker device 60.

Figure 10:
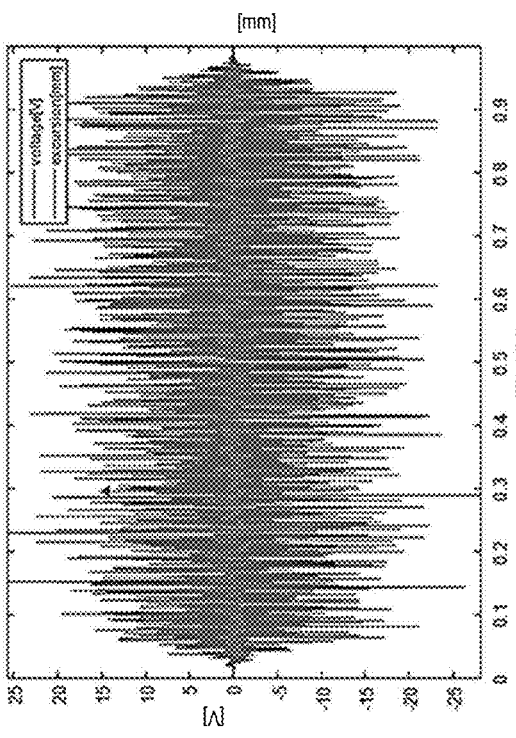
FIG. 10 is an example graph representing training data for training the TDNN, in accordance with an embodiment.

FIG. 10 is an example graph 520 representing training data for training the TDNN 400, in accordance with an embodiment. A horizontal axis of the graph 520 represents time in s. A first vertical axis of the graph 520 represents voltage in V. A second vertical axis of the graph 520 represents excursion (i.e., displacement) in mm. The graph 520 illustrates: (1) voltage samples recorded (i.e., measured) at a loudspeaker device 60 during playback of a stimulus voltage (e.g., during the training phase), and (2) displacement samples recorded at the loudspeaker device 60, wherein each displacement sample comprises an excursion of one or more moving components of the loudspeaker device 60 during the playback of the stimulus voltage. The voltage samples and displacement samples are fed to the TDNN 400 as training data during the training phase to train the TDNN 400 to learn the mapping between voltage and displacement of the one or more moving components of the loudspeaker device 60.

Figure 11:
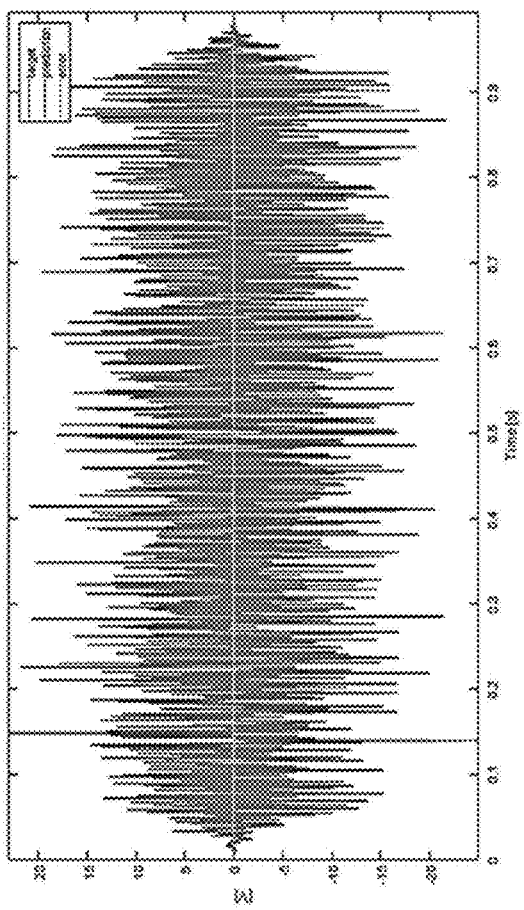
FIG. 11 is an example graph representing simulation results of the TDNN trained based on the training data of FIG. 10, in accordance with an embodiment.

FIG. 11 is an example graph 530 representing simulation results of the TDNN 400 trained based on the training data of FIG. 10, in accordance with an embodiment. A horizontal axis of the graph 530 represents time in s. A vertical axis of the graph 530 represents voltage in V. The graph 530 illustrates: (1) a target voltage to apply to the loudspeaker device 60 to reproduce a sample of a given audio program material, (2) an estimated (i.e., predicted) voltage to apply to the loudspeaker device 60 to reproduce the same sample, wherein the estimated voltage is determined utilizing the TDNN 400 trained based on the training data of FIG. 10, and (3) a relative error between the target voltage and the estimated voltage. As shown in FIG. 11, the estimated voltage substantially matches the target voltage. In one embodiment, the relative error is less than 1.0%.

Figure 12:
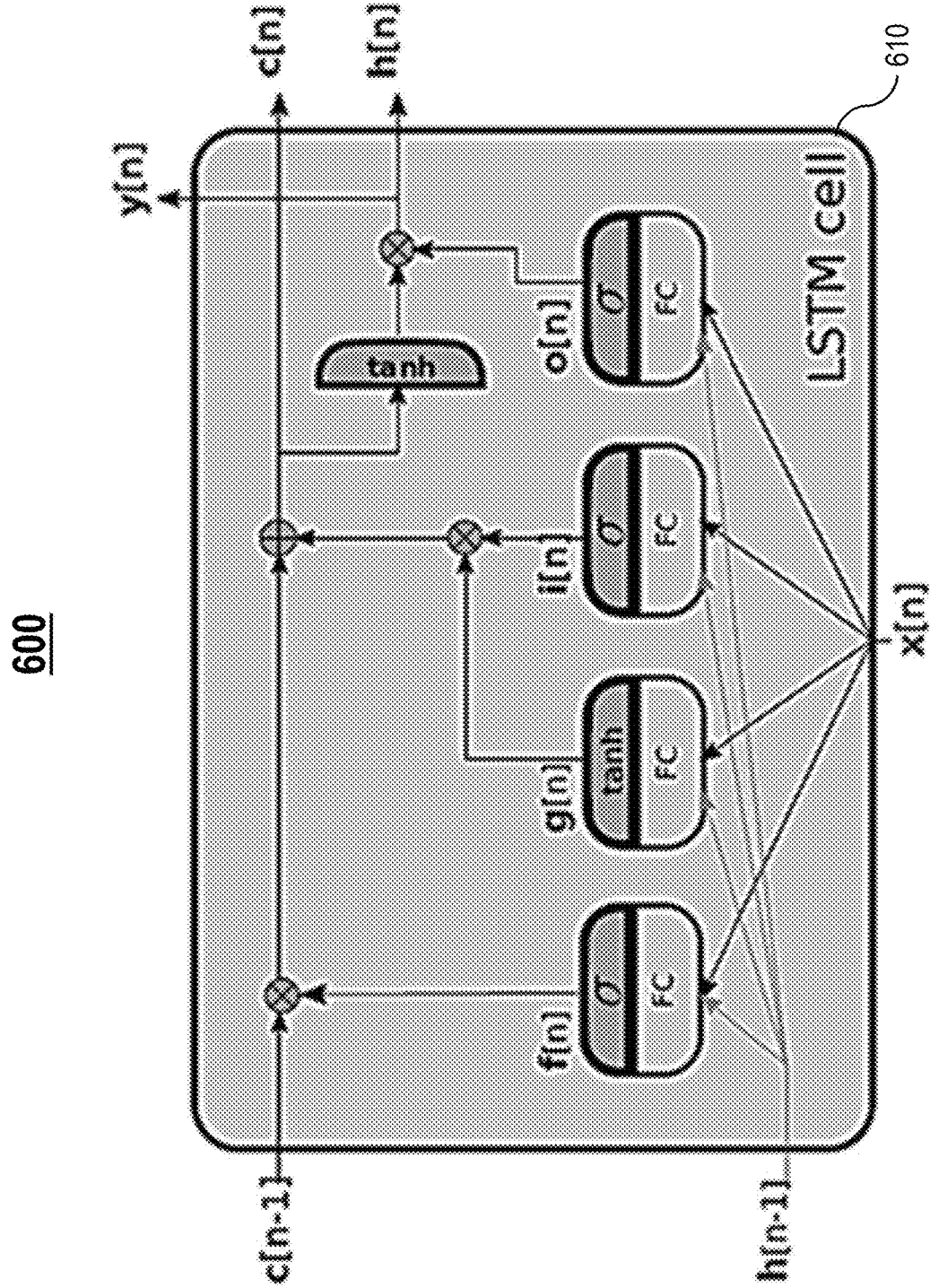
FIG. 12 illustrates an example long short-term memory (LSTM) network, in accordance with an embodiment.

FIG. 12 illustrates an example long short-term memory (LSTM) network 600, in accordance with an embodiment. In one embodiment, the trained neural network 210 is a recurrent neural network. For example, in one embodiment, the trained neural network 210 is a LSTM network 600. The LSTM network 600 is configured to capture long term dependencies useful in modeling slow evolutions of loudspeaker parameters (e.g., time-varying stiffness of diaphragm suspension, warming, etc.) that are dependent on long term history of input signals.

In one embodiment, a layer of the LSTM network 600 comprises one or more LSTM cells 610. At time step n, a LSTM cell 610 of the layer is configured to receive an input vector x[n] of past displacement samples, and generate an output vector y[n] of estimated voltages. At time step n, the LSTM cell 610 includes the following components: (1) a forget gate $f$[n] (e.g., Sigmoid activation function), (2) a candidate layer g[n] (e.g., Tan h activation function), (3) an input gate i[n] (e.g., Sigmoid activation function), (4) an output gate o[n] (e.g., Sigmoid activation function), (5) a hidden state h[n] (e.g., a vector), and (6) a memory state c[n] (e.g., a vector). The hidden state h[n] contains an output of the layer for time step n.

The memory state c[n] contains information learned from previous time steps (e.g., c[n−1]). At each time step n, the layer updates the memory state c[n] by adding information to, or removing information, from the memory state c[n]. As shown in FIG. 12, the layer controls updates to the memory state c[n] using the gates of the LSTM cell 610.

Figure 13:
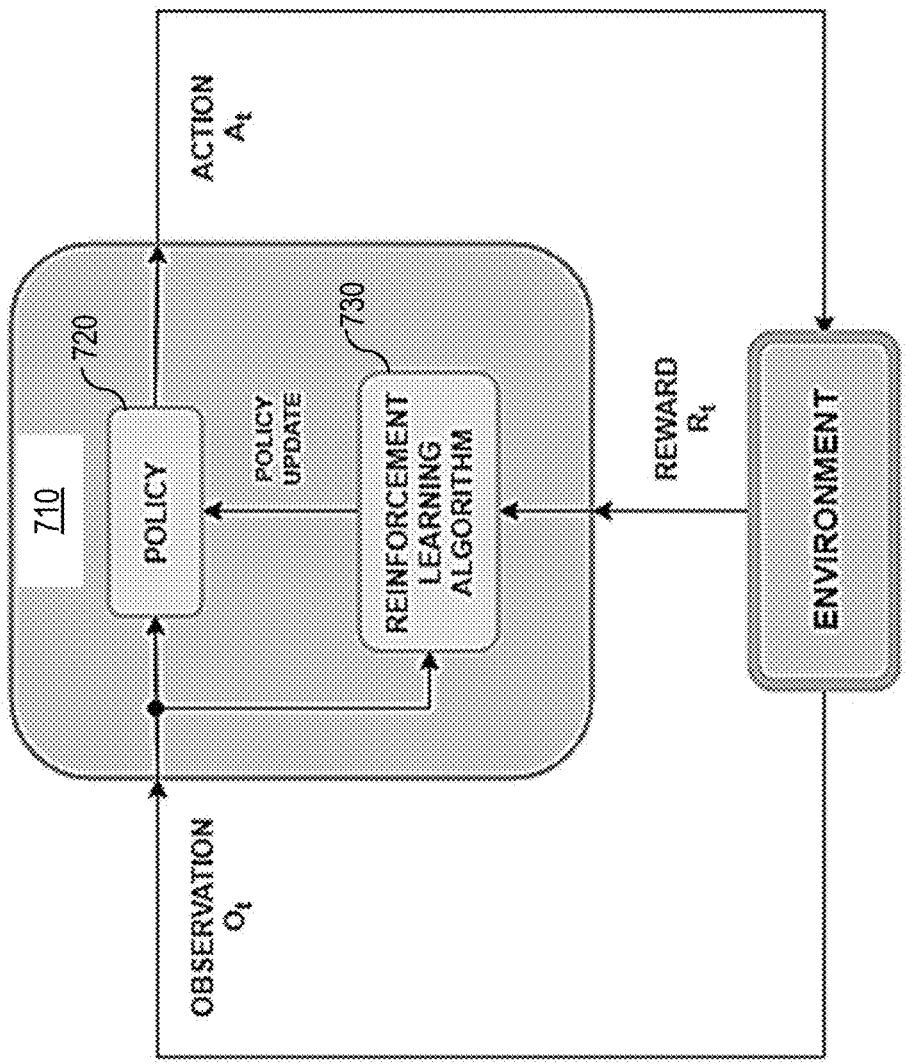
FIG. 13 illustrates an example workflow implemented by a deep reinforcement learning network, in accordance with an embodiment.

FIG. 13 illustrates an example workflow 700 implemented by a deep reinforcement learning network 710, in accordance with an embodiment. In one embodiment, the trained neural network 210 is a deep reinforcement learning network 710. The deep reinforcement learning network 710 is configured to: (1) learn the mapping between voltage and displacement of one or more moving components of a loudspeaker device 60 on the fly, and (2) continuously update the mapping.

Let $A_t$ generally denote an action applied to an environment including the loudspeaker device 60 at time step t, let $O_t$ generally denote an observation observed at the environment at time step t, and let $R_t$ generally denote a reward computed/derived based on the environment at time step t.

To reproduce a sample of a given audio program material at time step t via the loudspeaker device 60, the deep reinforcement learning network 710 estimates an input control voltage (e.g., $u_{control}$) to apply to the loudspeaker device 60 at time step t. The application of the input control voltage to the loudspeaker device 60 at time step t represents an action $A_t$.

In response to the action $A_t$, the deep reinforcement learning network 710 receives an observation $O_t$ and a reward $R_t$. In one embodiment, the observation $O_t$ comprises: (1) an actual/measured state of the loudspeaker device 60 (e.g., actual displacement, current, velocity) at time step t, and (2) a next sample of the given audio program material to reproduce at time step t+1 via the loudspeaker device 60. In one embodiment, the reward $R_t$ comprises an error representing a difference between a target state of the loudspeaker device 60 at time step t (e.g., target displacement, current, velocity) and the actual/measured state of the loudspeaker device 60. The lower the error, the higher the reward $R_t$.

To determine a next action $A_{t+1}$ (i.e., a next input control voltage to apply to the loudspeaker device 60 at time step t+1), the deep reinforcement learning network 710 applies a policy 720 that receives the current observation $O_t$ as input.

To update the policy 720 (i.e., update one or more parameters of the policy 720), the deep reinforcement learning network 710 applies a reinforcement learning algorithm 730 that receives the current observation $O_t$ and the reward $R_t$ as inputs. In one embodiment, the reinforcement learning algorithm 730 applied aims to maximize a reward $R_t$.

Figure 14:
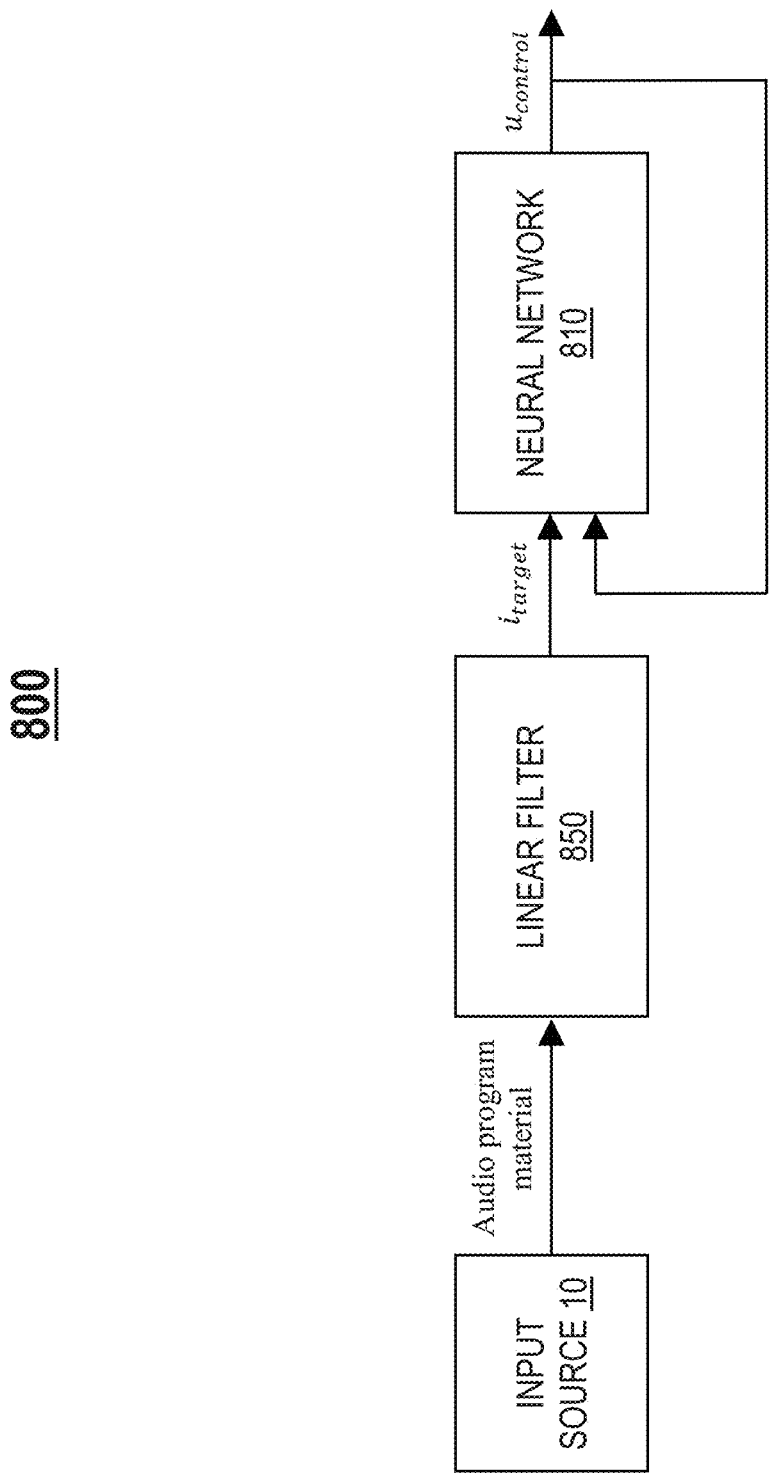
FIG. 14 illustrates another example nonlinear control system for nonlinear control of a loudspeaker device with a trained neural network, in accordance with one embodiment.

FIG. 14 illustrates another example nonlinear control system 800 for nonlinear control of a loudspeaker device 60 with a trained neural network 810, in accordance with one embodiment. In one embodiment, each of the loudspeaker system 100 (FIG. 2A), 105 (FIG. 2B) comprises the nonlinear control system 800 instead of the nonlinear control system 200 (FIGS. 2A-2B).

In one embodiment, during a training phase, a neural network 810 is trained (e.g., via the training system 300) to learn the mapping (i.e., relationship) between voltage and current flowing through a driver coil 57 of the loudspeaker device 60 based on training data comprising voltage samples and current samples.

In one embodiment, the nonlinear control system 800 is configured to implement a deployment phase that involves utilizing the resulting trained neural network 810 to determine an input control voltage $u_{control}$ to apply to the loudspeaker device 60 during audio reproduction of a given audio program material to obtain a target current target flowing through the driver voice coil 57 of the loudspeaker device 60.

In one embodiment, the nonlinear control system 800 comprises a linear filter 850 configured to: (1) receive, from an input source 10, a given audio program material (e.g., media content, such as music, speech, etc.) to reproduce via the loudspeaker device 60, and (2) utilize linear filtering to determine a target current $i_{target}$ flowing through the driver voice coil 57 of the loudspeaker device 60 that is required to reproduce the given audio program material. The target current $i_{target}$ is provided as input to the trained neural network 810.

In one embodiment, the trained neural network 810 is configured to: (1) receive (e.g., from the linear filter 850) a target current $i_{target}$ required to reproduce a given audio program material, and (2) determine an input control voltage $u_{control}$ to apply to the loudspeaker device 60 during the audio reproduction of the given audio program material to obtain the target current $i_{target}$.

In one embodiment, there is a feedback loop.

Figure 15:
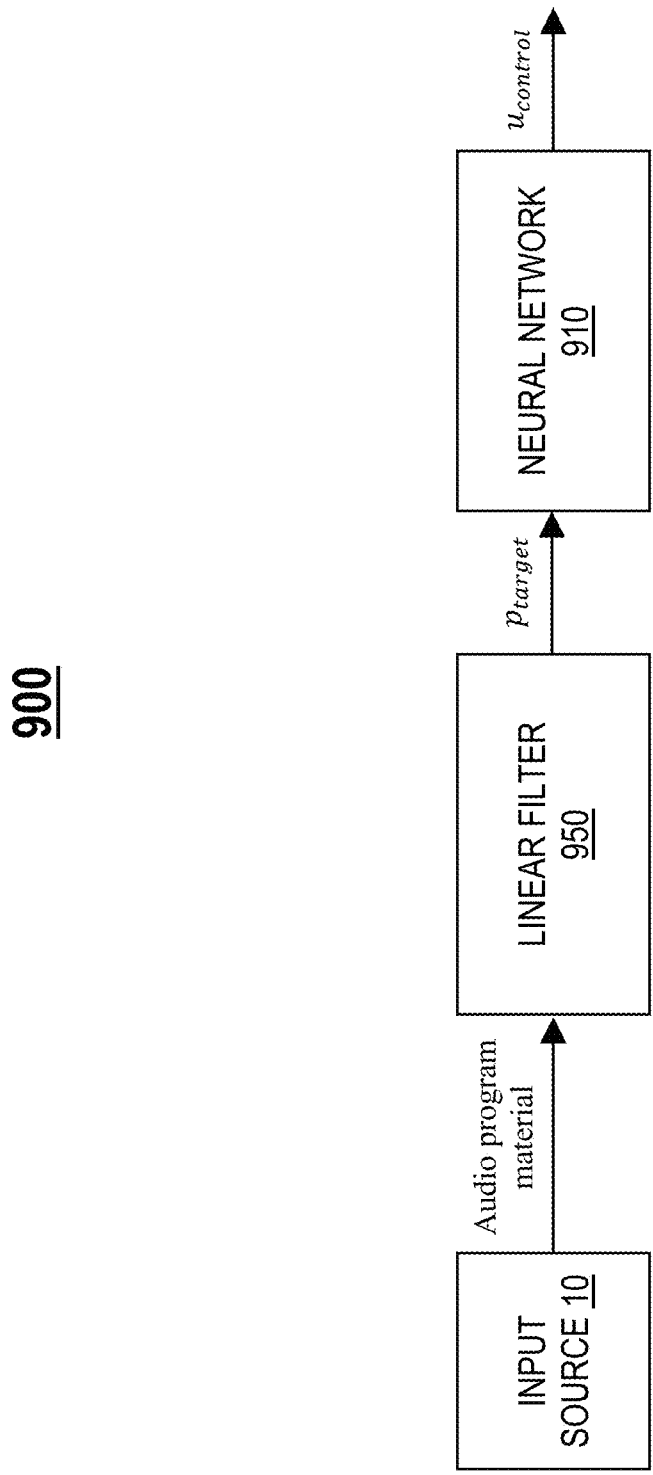
FIG. 15 illustrates yet another example nonlinear control system for nonlinear control of a loudspeaker device with a trained neural network, in accordance with one embodiment.

FIG. 15 illustrates yet another example nonlinear control system 900 for nonlinear control of a loudspeaker device 60 with a trained neural network 910, in accordance with one embodiment. In one embodiment, each of the loudspeaker system 100 (FIG. 2A), 105 (FIG. 2B) comprises the nonlinear control system 900 instead of the nonlinear control system 200 (FIGS. 2A-2B).

In one embodiment, during a training phase, a neural network 910 is trained (e.g., via the training system 300) to learn the mapping (i.e., relationship) between voltage and sound pressure in the loudspeaker device 60 based on training data comprising voltage samples and sound pressure samples.

In one embodiment, the nonlinear control system 900 is configured to implement a deployment phase that involves utilizing the resulting trained neural network 910 to determine an input control voltage $u_{control}$ to apply to the loudspeaker device 60 during audio reproduction of a given audio program material to obtain a target pressure $p_{target}$ in the loudspeaker device 60.

In one embodiment, the nonlinear control system 900 comprises a linear filter 950 configured to: (1) receive, from an input source 10, a given audio program material (e.g., media content, such as music, speech, etc.) to reproduce via the loudspeaker device 60, and (2) utilize linear filtering to determine a target pressure $p_{target}$ in the loudspeaker device 60 that is required to reproduce the given audio program material. The target pressure $p_{target}$ is provided as input to the trained neural network 910.

In one embodiment, the trained neural network 910 is configured to: (1) receive (e.g., from the linear filter 950) a target pressure $p_{target}$ required to reproduce a given audio program material, and (2) determine an input control voltage $u_{control}$ to apply to the loudspeaker device 60 during the audio reproduction of the given audio program material to obtain the target pressure $p_{target}$.

Unlike conventional solutions, each of the nonlinear control systems 200, 800, and 900 is non-complex and simple to implement, setup, and operate. Further, each of the nonlinear control systems 200, 800, and 900 do not necessarily rely on physical models that insufficiently capture nonlinear dynamics of loudspeakers. As stated above, nonlinear parameters of loudspeakers are difficult to estimate/measure precisely (e.g., requires special equipment and expertise).

Figure 16:
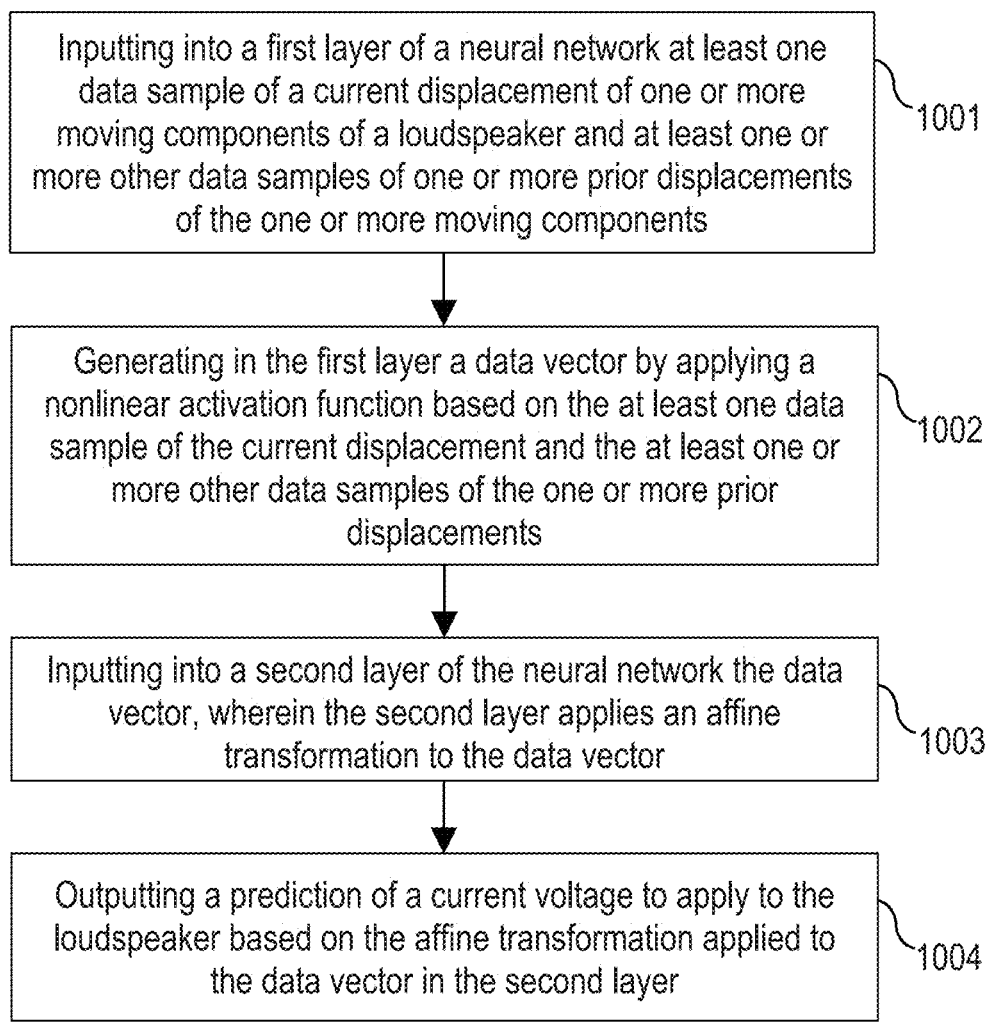
FIG. 16 is an example flowchart of a process for nonlinear control of a loudspeaker with a neural network, in accordance with an embodiment.

FIG. 16 is an example flowchart of a process 1000 for nonlinear control of a loudspeaker with a neural network, in accordance with an embodiment. Process block 1001 includes inputting into a first layer (e.g., input layer 410) of a neural network (e.g., TDNN 400) at least one data sample of a current displacement of one or more moving components of a loudspeaker (e.g., loudspeaker device 60) and at least one or more other data samples of one or more prior displacements of the one or more moving components. Process block 1002 includes generating in the first layer a data vector by applying a nonlinear activation function based on the at least one data sample of the current displacement and the at least one or more other data samples of the one or more prior displacements. Process block 1003 includes inputting into a second layer (e.g., hidden layer 420) of the neural network the data vector, wherein the second layer applies an affine transformation (e.g., linear combination) to the data vector. Process block 1004 includes outputting a prediction of a current voltage to apply to the loudspeaker based on the affine transformation applied to the data vector in the second layer. In some embodiments, one or more additional processes include applying, in the first layer prior to generating the data vector, an additional affine transformation to the at least one data sample of the current displacement and the at least one or more other data samples of the one or more prior displacements, wherein the data vector is generated by applying the nonlinear activation function to a result of the additional affine transformation applied to the at least one data sample of the current displacement and the at least one or more other data samples of the one or more prior displacements. In some embodiments (e.g., during a deployment/inference/running phase), an input source data (e.g., music, speech, etc.) can be received into the neural network that is trained, and a target displacement of the loudspeaker for the input source data can be determined based on the prediction of the current (adequate) voltage that will yield the target displacement.

In one embodiment, one or more components of the nonlinear control system 200, the nonlinear control system 800, and/or the nonlinear control system 900 are configured to perform process blocks 1001-1004 and/or other processes.

Figure 17:
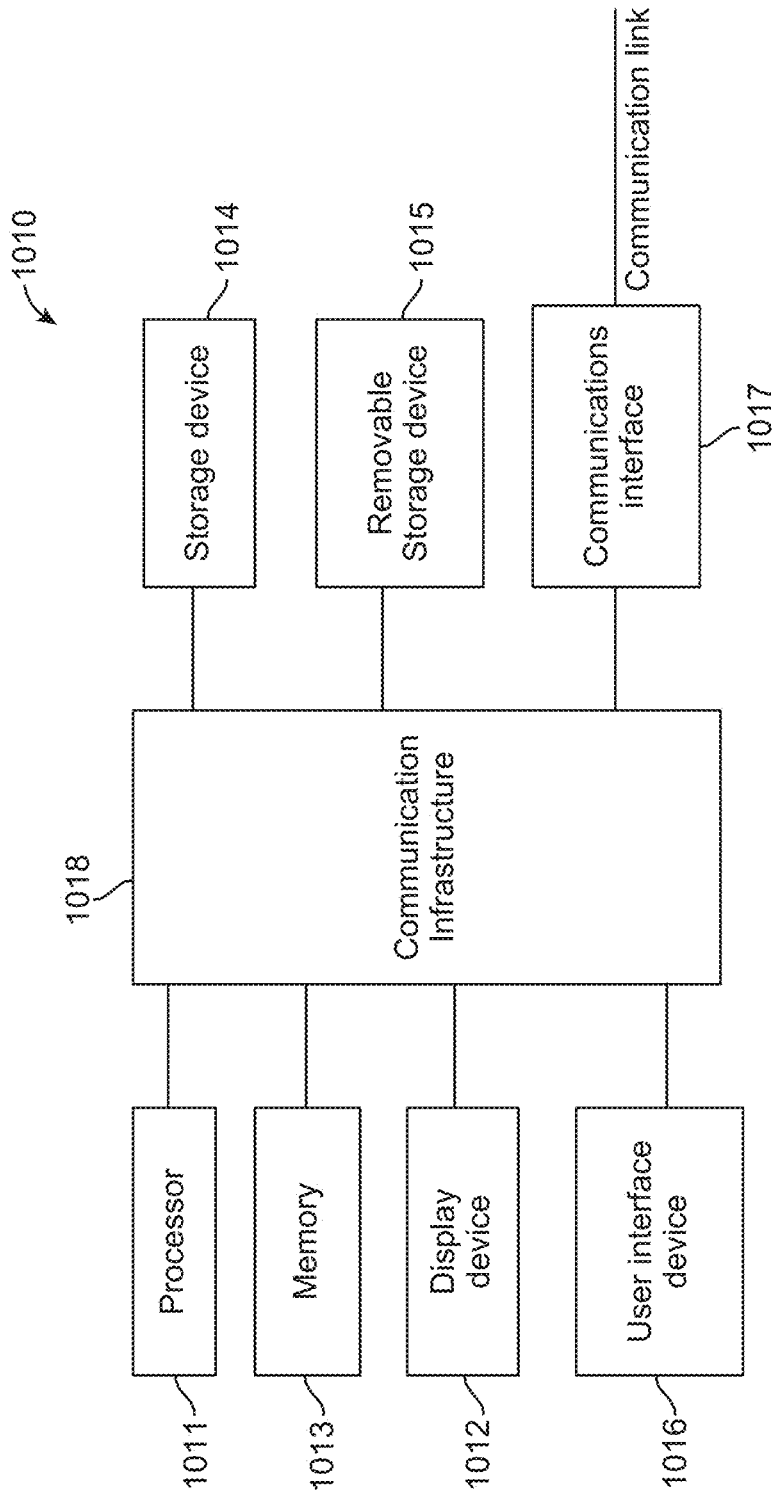
FIG. 17 is a high-level block diagram showing an information processing system comprising a computer system useful for implementing various disclosed embodiments.

FIG. 17 is a high-level block diagram showing an information processing system comprising a computer system 1010 useful for implementing various disclosed embodiments. The computer system 1010 includes one or more processors 1011, and can further include an electronic display device 1012 (for displaying video, graphics, text, and other data), a main memory 1013 (e.g., random access memory (RAM)), storage device 1014 (e.g., hard disk drive), removable storage device 1015 (e.g., removable storage drive, removable memory module, a magnetic tape drive, optical disk drive, computer readable medium having stored therein computer software and/or data), user interface device 1016 (e.g., keyboard, touch screen, keypad, pointing device), and a communication interface 1017 (e.g., modem, a network interface (such as an Ethernet card), a communications port, or a PCMCIA slot and card).

The communication interface 1017 allows software and data to be transferred between the computer system 1010 and external devices. The nonlinear controller 1010 further includes a communications infrastructure 1018 (e.g., a communications bus, cross-over bar, or network) to which the aforementioned devices/modules 1011 through 1017 are connected.

Information transferred via the communications interface 1017 may be in the form of signals such as electronic, electromagnetic, optical, or other signals capable of being received by communications interface 1017, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer-implemented process. In one embodiment, processing instructions for process 1000 (FIG. 16) may be stored as program instructions on the memory 1013, storage device 1014, and/or the removable storage device 1015 for execution by the processor 1011.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method, or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A computer-implemented method comprising:
   inputting, by a computing system, into a first layer of a neural network at least one data sample of a current displacement of one or more moving components of a loudspeaker and at least one or more other data samples of one or more prior displacements of the one or more moving components;
   generating, by the computing system, in the first layer a data vector by applying a nonlinear activation function based on the at least one data sample of the current displacement and the at least one or more other data samples of the one or more prior displacements;
   inputting, by the computing system, into a second layer of the neural network the data vector, wherein the second layer applies an affine transformation to the data vector; and
   outputting, by the computing system, a prediction of a current voltage to apply to the loudspeaker based on the affine transformation applied to the data vector in the second layer.

2. The method of claim 1, further comprising:
   applying, in the first layer prior to generating the data vector, an additional affine transformation to the at least one data sample of the current displacement and the at least one or more other data samples of the one or more prior displacements, wherein the data vector is generated by applying the nonlinear activation function to a result of the additional affine transformation applied to the at least one data sample of the current displacement and the at least one or more other data samples of the one or more prior displacements.

3. The method of claim 1, wherein the neural network is trained based on the at least one or more other data samples of the one or more prior displacements and one or more voltages associated with the one or more prior displacements.

4. The method of claim 3, further comprising:
   receiving input source data into the neural network that is trained; and
   determining, based on the prediction of the current voltage, a target displacement of the loudspeaker for the input source data.

5. The method of claim 4, further comprising:
   applying at least one of a linear filter, a limiter, or a compressor to the input source data prior to being received into the neural network that is trained.

6. The method of claim 1, wherein the one or more moving components of the loudspeaker comprise at least one of a diaphragm of a speaker driver of the loudspeaker, a driver voice coil of the speaker driver, or a former of the speaker driver.

7. The method of claim 1, further comprising:
   controlling an amount of voltage that a voltage source amplifier connected to the loudspeaker applies to the loudspeaker in accordance with the prediction of the current voltage to obtain a target displacement of the one or more moving components.

8. A system comprising:
   at least one processor; and
   a non-transitory processor-readable memory device storing instructions that when executed by the at least one processor causes the at least one processor to perform operations including:
   inputting into a first layer of a neural network at least one data sample of a current displacement of one or more moving components of a loudspeaker and at least one or more other data samples of one or more prior displacements of the one or more moving components;
   generating in the first layer a data vector by applying a nonlinear activation function based on the at least one data sample of the current displacement and the at least one or more other data samples of the one or more prior displacements;
   inputting into a second layer of the neural network the data vector, wherein the second layer applies an affine transformation to the data vector; and
   outputting a prediction of a current voltage to apply to the loudspeaker based on the affine transformation applied to the data vector in the second layer.

9. The system of claim 8, wherein the operations further comprise:
  applying, in the first layer prior to generating the data vector, an additional affine transformation to the at least one data sample of the current displacement and the at least one or more other data samples of the one or more prior displacements, wherein the data vector is generated by applying the nonlinear activation function to a result of the additional affine transformation applied to the at least one data sample of the current displacement and the at least one or more other data samples of the one or more prior displacements.

10. The system of claim 8, wherein the neural network is trained based on the at least one or more other data samples of the one or more prior displacements and one or more voltages associated with the one or more prior displacements.

11. The system of claim 10, wherein the operations further comprise:
  receiving input source data into the neural network that is trained; and
  determining, based on the prediction of the current voltage, a target displacement of the loudspeaker for the input source data.

12. The system of claim 11, wherein the operations further comprise:
  applying at least one of a linear filter, a limiter, or a compressor to the input source data prior to being received into the neural network that is trained.

13. The system of claim 8, wherein the one or more moving components of the loudspeaker comprise at least one of a diaphragm of a speaker driver of the loudspeaker, a driver voice coil of the speaker driver, or a former of the speaker driver.

14. The system of claim 8, wherein the operations further comprise:
  controlling an amount of voltage that a voltage source amplifier connected to the loudspeaker applies to the loudspeaker in accordance with the prediction of the current voltage to obtain a target displacement of the one or more moving components.

15. A loudspeaker device comprising:
  a speaker driver including one or more moving components;
  a voltage source amplifier connected to the speaker driver; and
  a controller connected to the voltage source amplifier, wherein the controller is configured to:
  input into a first layer of a neural network at least one data sample of a current displacement of the one or more moving components and at least one or more other data samples of one or more prior displacements of the one or more moving components;
  generate in the first layer a data vector by applying a nonlinear activation function based on the at least one data sample of the current displacement and the at least one or more other data samples of the one or more prior displacements;
  input into a second layer of the neural network the data vector, wherein the second layer applies an affine transformation to the data vector; and
  output a prediction of a current voltage to apply to the speaker driver based on the affine transformation applied to the data vector in the second layer.

16. The loudspeaker device of claim 15, wherein the controller is further configured to:
  apply, in the first layer prior to generating the data vector, an additional affine transformation to the at least one data sample of the current displacement and the at least one or more other data samples of the one or more prior displacements, wherein the data vector is generated by applying the nonlinear activation function to a result of the additional affine transformation applied to the at least one data sample of the current displacement and the at least one or more other data samples of the one or more prior displacements.

17. The loudspeaker device of claim 15, wherein the neural network is trained based on the at least one or more other data samples of the one or more prior displacements and one or more voltages associated with the one or more prior displacements.

18. The loudspeaker device of claim 17, wherein the controller is further configured to:
  receive input source data into the neural network that is trained; and
  determine, based on the prediction of the current voltage, a target displacement of the loudspeaker device for the input source data.

19. The loudspeaker device of claim 18, wherein the controller is further configured to:
  apply at least one of a linear filter, a limiter, or a compressor to the input source data prior to being received into the neural network that is trained.

20. The loudspeaker device of claim 15, wherein the controller is further configured to:
  control an amount of voltage that the voltage source amplifier applies to the speaker driver in accordance with the prediction of the current voltage to obtain a target displacement of the one or more moving components.

* * * * *